United States Patent [19]

Ohno

[11] Patent Number: 5,801,443
[45] Date of Patent: Sep. 1, 1998

[54] SEMICONDUCTOR DEVICE WITH SHORT CIRCUIT PREVENTION AND METHOD OF MANUFACTURING THEREOF

[75] Inventor: Yoshikazu Ohno, Tokyo, Japan

[73] Assignee: Mitsubishi Denki Kabushiki Kaisha, Tokyo, Japan

[21] Appl. No.: 885,819

[22] Filed: Jun. 30, 1997

[30] Foreign Application Priority Data

Aug. 19, 1996 [JP] Japan .................................. 8-217439

[51] Int. Cl.⁶ .......................... H01L 23/48; H01L 23/52; H01L 29/40
[52] U.S. Cl. ................................ 257/758; 257/750
[58] Field of Search ...................... 257/750, 758, 257/759, 760

[56] References Cited

U.S. PATENT DOCUMENTS

| | | | |
|---|---|---|---|
| 5,341,026 | 8/1994 | Harada et al. | |
| 5,500,558 | 3/1996 | Hayashide | 257/758 |
| 5,532,516 | 7/1996 | Pasch et al. | 257/758 |
| 5,631,478 | 5/1997 | Kumura | 257/758 |
| 5,717,251 | 2/1998 | Hayashi et al. | 257/758 |

FOREIGN PATENT DOCUMENTS 5-75060  3/1993  Japan .

Primary Examiner—Mahshid D. Saadat
Assistant Examiner—S. V. Clark
Attorney, Agent, or Firm—McDermott, Will & Emery

[57] ABSTRACT

A semiconductor device including a first wiring layer formed on a main surface of a semiconductor substrate, and a first insulating film layer having first and second contact holes which reach the main surface of the semiconductor substrate formed on the first wiring layer. A second wiring layer is formed on the first insulating film layer, and a first electric conductor, connected electrically to the semiconductor substrate, is formed in the first contact hole by self-alignment with respect to the first wiring layer and is isolated electrically from the first wiring layer. A second electric conductor, electrically connecting the second wiring layer to the semiconductor substrate is formed in the second contact hole by self-alignment with respect to the first wiring layer and is isolated electrically from the first wiring layer. A second insulating film layer is formed on the second wiring layer and has a third contact hole which reaches the first contact hole. A first electrode (or third wiring layer), formed on the second insulating film layer and in the third contact hole by self-alignment with respect to the second wiring layer, is electrically connected to the first electric conductor and is electrically insulated from the second wiring layer, since the bit line and gate electrode are not exposed in the contact hole when the contact hole was formed. Therefore, a semiconductor device of high integration is formed without any short circuit between the capacitor electrode and bit line or gate electrode and without any short circuit between the bit line and gate electrode.

9 Claims, 34 Drawing Sheets

SEMICONDUCTOR DEVICE WITH SHORT CIRCUIT PREVENTION AND METHOD OF MANUFACTURING THEREOF

BACKGROUND OF THE INVENTION

1. Field of the Invention

This invention relates to a semiconductor device and a method of manufacturing thereof, and more particularly, to a contact hole formed for electrically connecting a semiconductor substrate to a wiring layer or electrode.

2. Background Art

In recent years, a wiring layer of a semiconductor device is reduced more and more according to an increasingly higher integration of an element in the semiconductor device, for example, a DRAM (Dynamic Random Access Memory).

FIG. 45 shows a sectional view of a DRAM. In FIG. 45, the DRAM includes a silicon substrate 1; an isolated oxide film 2 which is formed on a surface of the silicon substrate 1; a gate oxide 3 which is formed on a main surface of the silicon substrate 1; a word line 4 which is formed on the gate oxide 3; an insulating film 5 which is formed on the word line 4; an impurity diffusion region 6 which is formed on the surface of the silicon substrate 1 serving as a source and a drain region; and a side wall spacer 7 which is formed on each sides of the gate oxide 3, the word line 4 and the insulating film 5. The word line 4 is a gate electrode of the DRAM (hereinafter referred to as "gate electrode 4"). A MOS transistor is formed by the gate oxide 3, the gate electrode 4, the insulating film 5, the impurity diffusion region 6 and the side wall spacer 7.

Further, the DRAM includes an insulating film layer 8 which is formed on top of the MOS transistor, a bit line 13a which is formed on top of the insulating film layer 8 and is connected to the impurity diffusion region 6 electrically through a electric conductor film 12a in a contact hole 11; another insulating film layer 14 which is formed on top of the insulating film layer 8; a capacitor which comprises a lower electrode 18a, an induced electricity layer 20 and an upper electrode 21 on the insulating film layer 14; an insulating film layer 22 which is formed on the capacitor, and a wiring layer 23 which is formed on the insulating film layer 22. The wiring layer 23 is electrically connected to the internal wiring of the semiconductor device. The lower electrode 18a is electrically connected to the impurity diffusion region 6 by a contact hole 17.

A method of manufacturing of the above DRAM is shown in FIGS. 46–58. These figures show thirteen steps of the manufacturing process.

As shown in FIG. 46, the isolated oxide film 2, the gate oxide 3, the gate electrode 4, the insulating film 5, the impurity diffusion region 6 and the side wall spacer 7 are formed on the silicon substrate 1. The insulating film layer 8 is formed on the above elements as shown in FIG. 47. In FIG. 48, a photoresist is coated on the insulating film layer 8, and a resist pattern 10 having an opening portion 9 is formed after a proceeding photolithography process. The insulating film layer 8 is etched according to the resist pattern 10 as a mask, and a contact hole 11 is formed.

Next, after removing the resist pattern 10, the electric conductor film 12 is formed on the insulating film layer 8 and in the contact hole 11 as shown in FIG. 49. An electric conductor 12a is formed in the contact hole 11 according to an etching back technique of all the surface of the electric conductor film 12 as shown in FIG. 50. As shown in FIG. 51, a resist pattern 60 is formed by a photolithography process after forming a photoresist on an electric conductor layer 13. As shown in FIG. 52, the bit line 13a is formed by an etching process using the resist pattern 60 as a mask.

As shown in FIG. 53, after the insulating film layer 14 is formed on the insulating film layer 8 and the bit line 13a is formed, a photoresist is coated on the insulating film layer 14, and a resist pattern 16 having an opening portion 15 is formed according to a photolithography process. As shown in FIG. 54, the contact hole 17 is formed by an etching process on the insulating film layer 14 and the insulating film layer 8 according to the resist pattern 16 as a mask.

After removing the resist pattern 16, as shown in FIG. 55, an electric conductor film 18 is formed on the insulating film layer 14 and in the contact hole 17. After forming a photoresist on the electric conductor film 18, a resist pattern 19 is formed on the electric conductor film 18 by a photolithography process. As shown in FIG. 56, the lower electrode 18a is formed by an etching process according to the resist pattern 19 as a mask. After removing the resist pattern 19, as shown in FIG. 57, the induced electricity layer 20 and the electric conductor film 21 as the upper electrode 21 of the capacitor are formed. As shown in FIG. 58, after forming on the insulating film layer 22, finally, the wiring layer 23 is formed on the insulating film layer 22.

The semiconductor device is formed as the above described, and an electric charge is charged in the capacitor or the charged electric charge is read to the bit line 13a by ON or OFF state of a transistor of DRAM.

In the above semiconductor device, the lower electrode 18a of the capacitor must connect to the impurity diffusion region 6 electrically but avoid contacting the bit line 13a and the gate electrode 4. However, the lower electrode 18a is difficult to connect to the impurity diffusion region 6 without contacting the bit line 13a and the gate electrode 4 according to an increase of a subdivision of a memory cell. As shown in FIG. 45, there is a problem in that the lower electrode 18a short circuits with the bit line 13a or the gate electrode 4 electrically because of exposure of the bit line 13a and the gate electrode 4 in the process for forming the contact hole 17.

Further, as shown in FIG. 59, it has the same problem on the electric conductor 12a, too. In short, the bit line 13a is short circuited with the gate electrode by the electric conductor 12a which is for connecting between the bit line 13a and the impurity diffusion region 6 electrically.

SUMMARY OF THE INVENTION

Accordingly, one object of the present invention is to provide a semiconductor device of high integration without any short circuit between the lower electrode 18a of the capacitor and the bit line 13 or the gate electrode 4 and without any short circuit between the bit line 13a and the gate electrode 4.

Another object of this invention is to provide a method of manufacturing it.

These and other objects are achieved by providing a new and improved semiconductor device including a first wiring layer formed on a main surface of a semiconductor substrate. A first insulating film layer having first and second contact holes which reach the main surface of the semiconductor substrate is formed on the first wiring layer. A second wiring layer is formed on the first insulating film layer, and the first electric conductor, which is connected electrically to the semiconductor substrate, is formed in the first contact hole by self-alignment with respect to the first wiring layer and is isolated electrically to the first wiring layer. The second electric conductor, which is for connecting electrically the second wiring layer to the semiconductor substrate, is formed in the second contact hole by self-alignment with respect to the first wiring layer and is isolated electrically to the first wiring layer. The second insulating film layer is formed on the second wiring layer and having a third contact hole which reach the first contact hole. Finally, a first electrode or a third wiring layer, which is formed on the second insulating film layer and in the third contact hole by self-alignment with respect to the second wiring layer, is connected electrically to the first electric conductor and is insulated electrically from the second wiring layer, since the bit line and gate electrode are not exposed in the contact hole when the contact hole was formed. Therefore, the semiconductor device of high integration is formed without any short circuit between the electrode of capacitor and the bit line or the gate electrode and without any short circuit between the bit line and the gate electrode.

DETAILED DESCRIPTION OF THE PREFERRED EMBODIMENTS (First Embodiment)

A first embodiment of the present invention is first described with reference to FIGS. 1–44.

Figure 1:
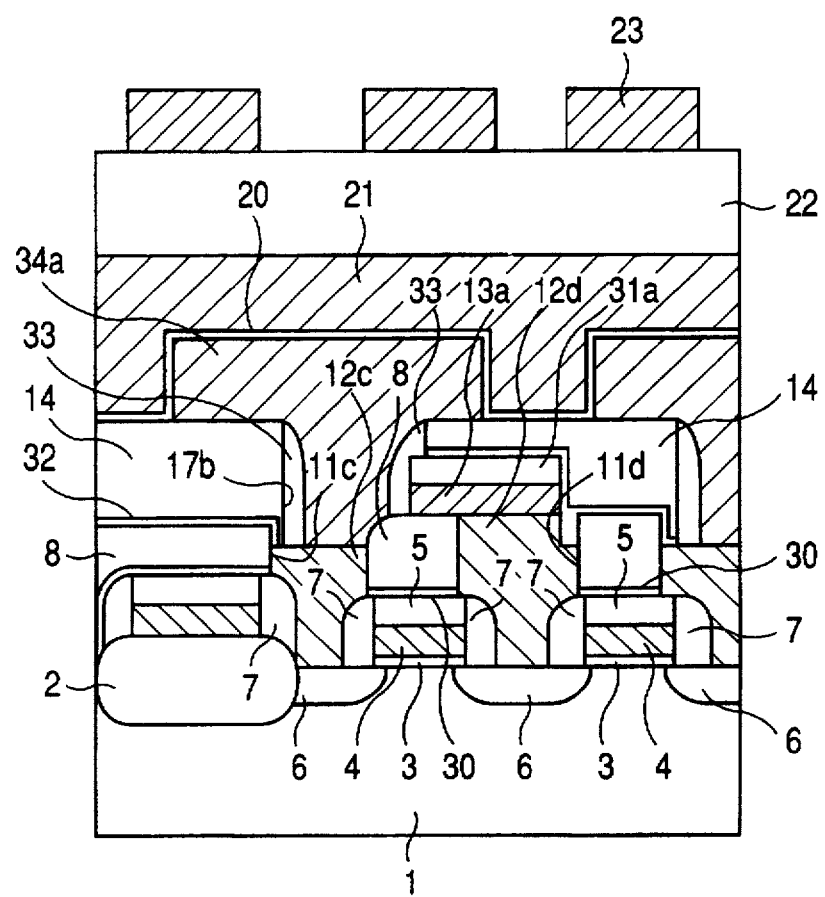
FIG. 1 is a sectional view of a semiconductor device of a first embodiment of the present invention.

FIG. 1 shows a sectional view of a semiconductor device of the first embodiment of the present invention, including a silicon substrate 1 as a semiconductor substrate; an isolated oxide film 2 which is formed on a surface of the silicon substrate 1; a gate oxide 3 which is formed on a main surface of the silicon substrate 1; a word line 4 of a first wiring layer which is formed on the gate oxide 3; an insulating film 5 which is formed on the word line 4; an impurity diffusion region 6 as a source and a drain region which is formed on the surface of the silicon substrate 1 and a side wall spacer 7 which is formed on each sides of the gate oxide 3, the word line 4 and the insulating film 5 and comprising silicon dioxide. The word line 4 is a gate electrode of the DRAM (hereinafter referred to as "gate electrode 4"). A MOS transistor comprises the gate oxide 3, the gate electrode 4, the insulating film 5, the impurity diffusion region 6 and the side wall spacer 7. The side wall spacer 7 is formed on the isolated oxide film 2 and on each side of the gate electrode 4 and the insulating film 5.

Further, the semiconductor device includes a silicon nitride ($Si_3N_4$) or silicon oxynitride (SiON) film 30 as a lower layer of a first insulating film layer which is formed on the transistor; a silicon dioxide film 8 as an upper layer of the first insulating film layer; contact holes 11c and 11d as a first hole and a second hole in the first insulating layer; a first electric conductor 12c in the contact hole 11c; a second electric conductor 12d in the contact hole 11d; and a bit line 13a as a second wiring layer having a insulating film layer 31a on the second electric conductor 12d. The bit line 13a is electrically connected to the impurity diffusion region 6 which is formed on the silicon substrate 1 by the second electric conductor 12d. The etching speed of the lower layer of the first insulating film layer is lower than that of the upper layer of the first insulating layer. The first and second electric conductors 12c and 12d are formed in the contact holes 11c and 11d by self-alignment with respect to the gate electrode 4.

The semiconductor device also includes a silicon nitride or silicon oxynitride film 32 as a lower layer of a second insulating film layer which is formed on the upper layer of the first insulating layer and the insulating layer 31a; a silicon dioxide film 14 as a upper layer of the second insulating film layer; a contact hole 17b as a third hole which is formed in the second insulating layer and which extends as far as the first electric conductor 12c; and a side wall spacer 33 comprising silicon dioxide which is formed on the inside wall of the contact hole 17b. The etching speed of the lower layer of the second insulating film layer is lower than that of the upper layer of the second insulating layer.

In addition, a lower electrode 34a of the capacitor is formed on the upper potion of the second insulating film layer (the silicon dioxide film 14) and in the contact hole 17b except for the side wall spacer 33. An induced electricity layer 20 of the capacitor is formed on the lower electrode 34a. An upper electrode 21 and an insulating film layer 22 are formed on the capacitor and a wiring layer 23 is formed on the insulating film layer 22. The lower electrode 34a is formed by self-alignment with respect to the bit line 13a and is electrically connected to the impurity diffusion region 6 by the first electric conductor 12c. The capacitor comprises the lower electrode 34a, the induced electricity layer 20, and the upper electrode 21. The wiring layer 23 is electrically connected to internal wiring (not shown) of the semiconductor device.

Next, FIGS. 2–18 show a sectional view of a method of manufacturing of the semiconductor device in FIG. 1.

Figure 2:
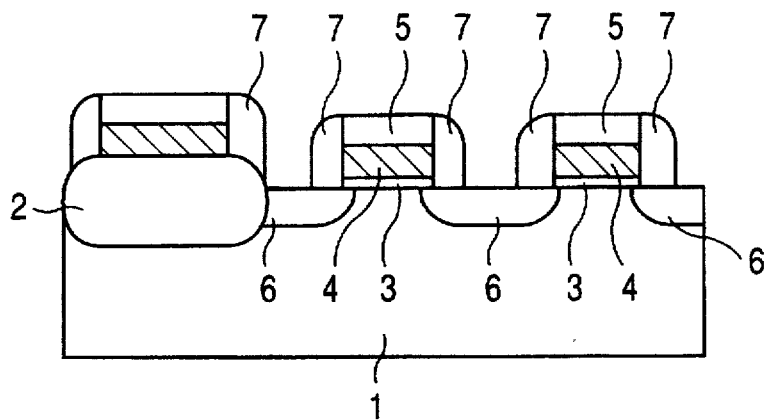
FIG. 2 is a sectional view of a first process step of a manufacturing of the semiconductor device in the first embodiment.

As shown in FIG. 2, the isolated oxide film 2 is formed on the silicon substrate 1 by a LOCOS (Local Oxidation of Silicon) technique. A silicon dioxide film, a polysilicon film with an impurity, and a silicon dioxide film are formed on the respective surfaces of the silicon substrate 1, the gate oxide 3, the gate electrode 4 and the insulating film 5 by a photolithography process. The impurity region layer 6 serving as a source and a drain are formed by an ion implantation process to the silicon substrate 1.

Next, silicon dioxide is deposited on the main surface of the semiconductor device in FIG. 2 by CVD (Chemical Vapor Deposition) techniques. The deposited main surface is etched back by anisotropic etching, and the side wall spacer 7 of silicon dioxide is formed on both of the sides of the gate oxides 3, the gate electrodes 4 and the insulating film 5, respectively. The MOS transistor is formed by the manufacturing process. The side wall spacer 7 of silicon dioxide is formed on both of the sides of the word line 4 and the insulating film 5 on the isolated oxide film 2.

Figure 3:
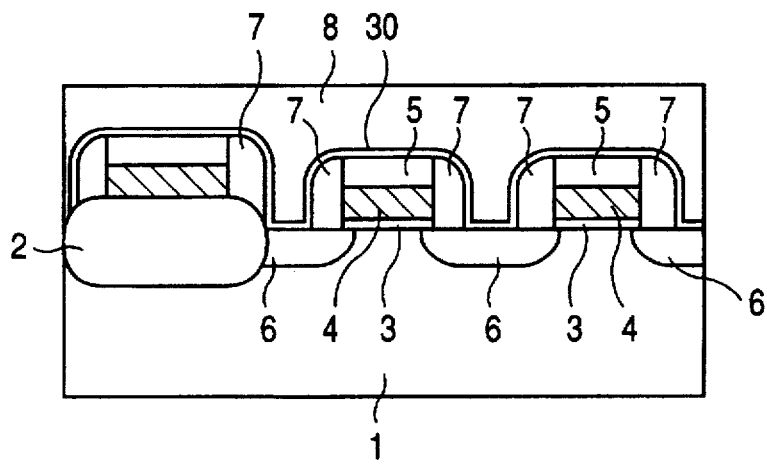
FIG. 3 is a sectional view of a second process step of the manufacturing of the semiconductor device in the first embodiment.

As shown in FIG. 3, the silicon nitride film ($Si_3N_4$) 30 or the silicon oxynitride film (SiON) 30 as the lower layer of the first insulating film layer is deposited on the surface by a CVD technique. The thickness of the film 30 is 50~1000 Å. Then, the silicon dioxide film 8 as the upper layer of the first insulating film layer is deposited on the surface by a CVD technique. The thickness of the silicon dioxide film 8 is 250~5000 Å.

Figure 4:
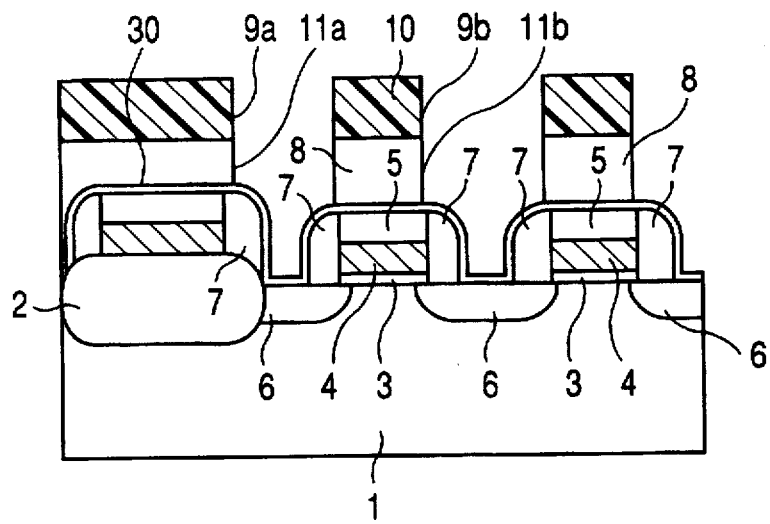
FIG. 4 is a sectional view of a third process step of the manufacturing of the semiconductor device in the first embodiment.

As shown in FIG. 4, photoresist is coated on the silicon dioxide film 8, and a resist pattern 10 having opening portions 9a and 9b is formed by a photolithography process. The etching speed of the silicon dioxide film 8 is faster than that of the silicon nitride film ($Si_3N_4$) 30 or the silicon oxynitride film (SiON) 30 as the lower layer of the first insulating film layer. Then, using the etching process, the silicon dioxide film 8 is dry-etched by RIE (Reactive Ion Etching) techniques, and contact holes 11a and 11b are formed in the silicon dioxide film 8.

The dry etching process of the silicon dioxide film 8, which has a faster etching speed than that of the silicon nitride ($Si_3N_4$) or silicon oxynitride film (silicon) 30, uses a fluorine carbon family gas, for example, c-$C_4F_8$, $C_3F_8$, $C_3F_6$, $C_5F_{12}$, $C_4F_8$, $C_5F_{10}$ $CHF_3$ or a mixture of these gases, a mixture of argon (Ar), carbon monoxide (CO) or oxygen ($O_2$) with the fluorine carbon family gas, or a mixture of Ar, CO or $O_2$ with the mixture of the fluorine carbon family gases.

Figure 5:
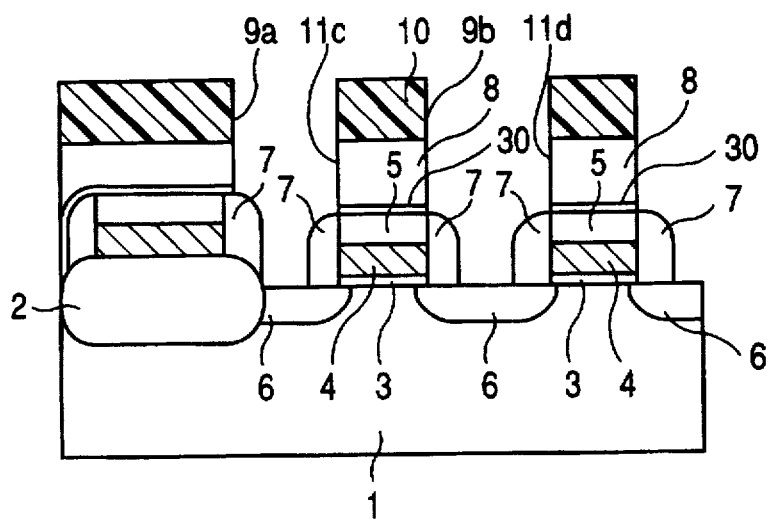
FIG. 5 is a sectional view of a fourth process step of the manufacturing of the semiconductor device in the first embodiment.

As shown in FIG. 5, the silicon nitride ($Si_3N_4$) or silicon oxynitride film (SiON) 30 is dry-etched by RIE techniques using $CF_4$ gas and the like, forming the contact holes 11c and 11d.

Figure 6:
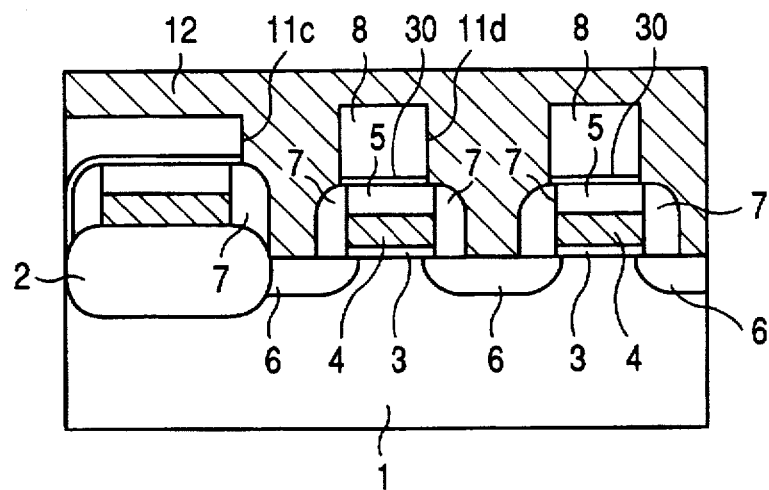
FIG. 6 is a sectional view of a fifth process step of the manufacturing of the semiconductor device in the first embodiment.
Figure 7:
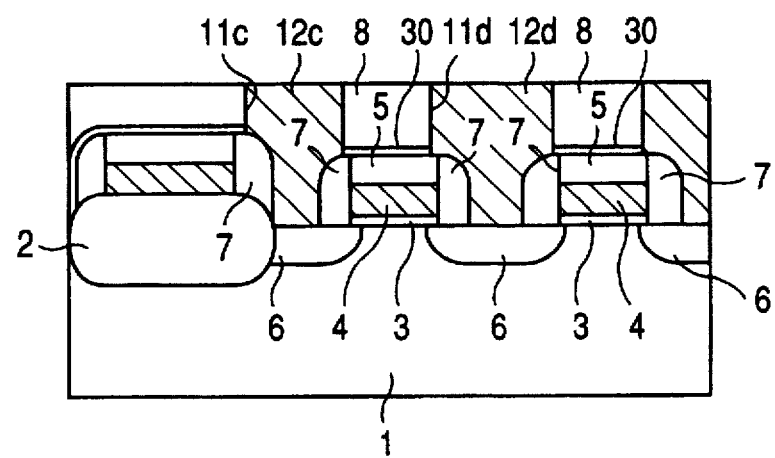
FIG. 7 is a sectional view of a sixth process step of the manufacturing of the semiconductor device in the first embodiment.

As shown in FIG. 6, after removing the resist pattern 10, polysilicon 12 is deposited on the main surface of the semiconductor device by CVD techniques. The density of phosphorus in the polysilicon 12 is $1 \times 10^{19} \sim 8 \times 10^{20}/cm^3$. As shown in FIG. 7, polysilicon 12 formed on the silicon dioxide film 8 is removed by an etching back technique, and the first and second electric conductors 12c and 12d are formed in the contact holes 11c and 11d, respectively.

Figure 8:
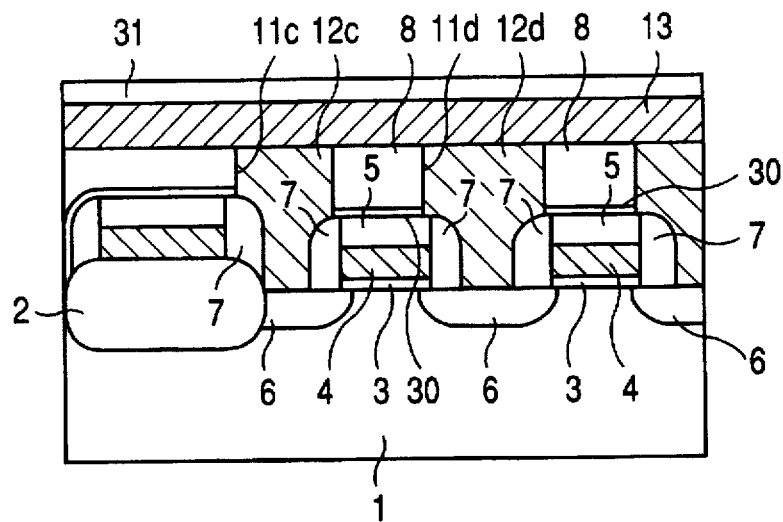
FIG. 8 is a sectional view of a seventh process step of the manufacturing of the semiconductor device in the first embodiment.

As shown in FIG. 8, the electric conductor layer 13 comprising a chemical compound of tungsten (W) and silicon (Si) or a chemical compound of titanium (Ti) and silicon (Si) is formed on the silicon dioxide film 8 and on the first and second electric conductors 12c and 12d by CVD techniques or sputter techniques, and an insulating film layer 31 is formed on the electric conductor layer 13 by CVD techniques. The insulating film layer 31 comprises silicon dioxide ($SiO_2$) and has a thickness of 300~3000 Å.

Figure 9:
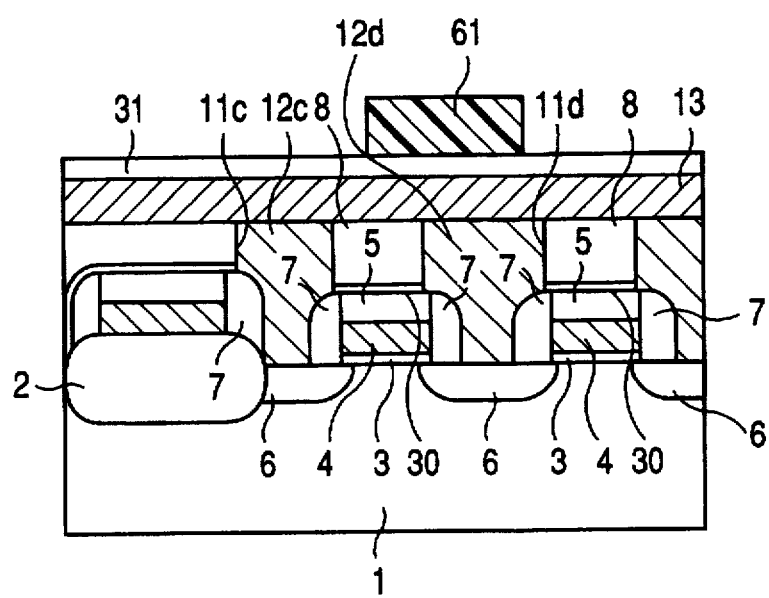
FIG. 9 is a sectional view of an eighth process step of the manufacturing of the semiconductor device in the first embodiment.
Figure 10:
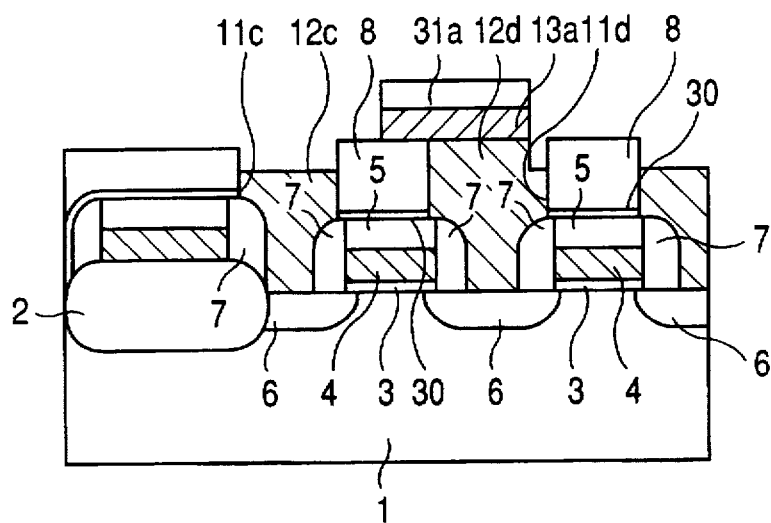
FIG. 10 is a sectional view of a ninth process step of the manufacturing of the semiconductor device in the first embodiment.

As shown in FIG. 9, photoresist is coated on the insulating film layer 31 (silicon dioxide film layer), and a resist pattern 61 is formed by a photolithography process. The insulating film layer 31 and the electric conductor layer 13 are etched using the resist pattern 61 as a mask, as shown in FIG. 10. Then, the bit line 13a having the insulating film layer 31a is formed as the second wiring layer. As shown in FIG. 10, a part of the surfaces of the first and second electric conductors 12c and 12d is slightly overetched. The resist pattern 61 is removed.

Figure 11:
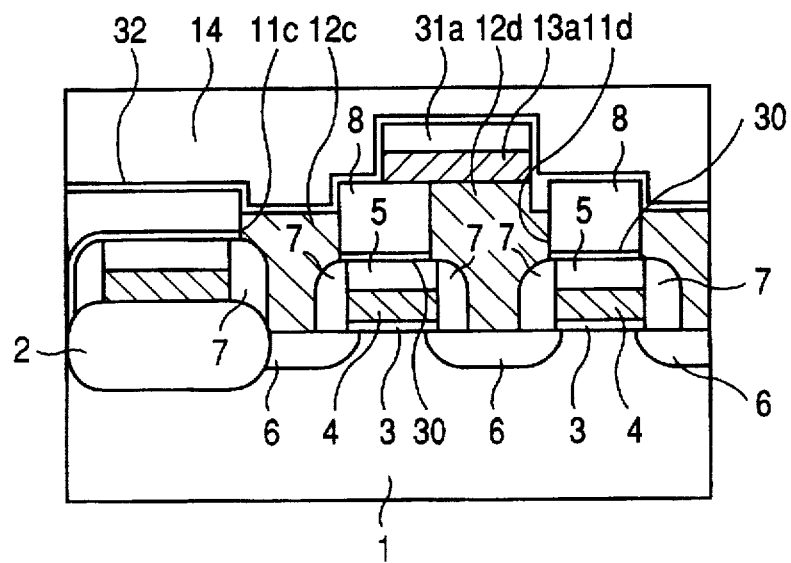
FIG. 11 is a sectional view of a tenth process step of the manufacturing of the semiconductor device in the first embodiment.

As shown in FIG. 11, the silicon nitride or silicon oxynitride film 32 as the lower layer of the second insulating film layer is formed on the surface by CVD techniques. The thickness of the lower layer of the second insulating film layer is 50~1000 Å. The silicon dioxide film 14 as the upper layer of the second insulating film layer is formed by CVD techniques. The thickness of the upper layer of the second insulating film layer is 250~5000 Å.

Figure 12:
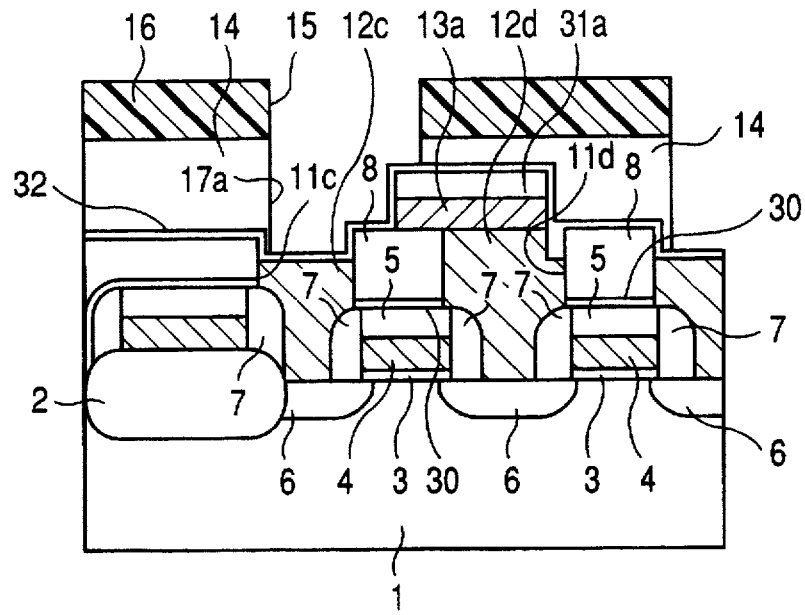
FIG. 12 is a sectional view of an eleventh process step of the manufacturing of the semiconductor device in the first embodiment.

As shown in FIG. 12, a photoresist is coated on the silicon dioxide film 14, and the resist pattern 16 having an opening portion 15 is formed by a photolithography process. The etching speed of the silicon dioxide film 14 is faster than that of the silicon oxynitride or silicon oxynitride film 32 as the lower layer of the second insulating film layer. Using an etching process, the silicon dioxide film 14 is dry-etched by RIE techniques, and a contact hole 17a is formed.

Figure 13:
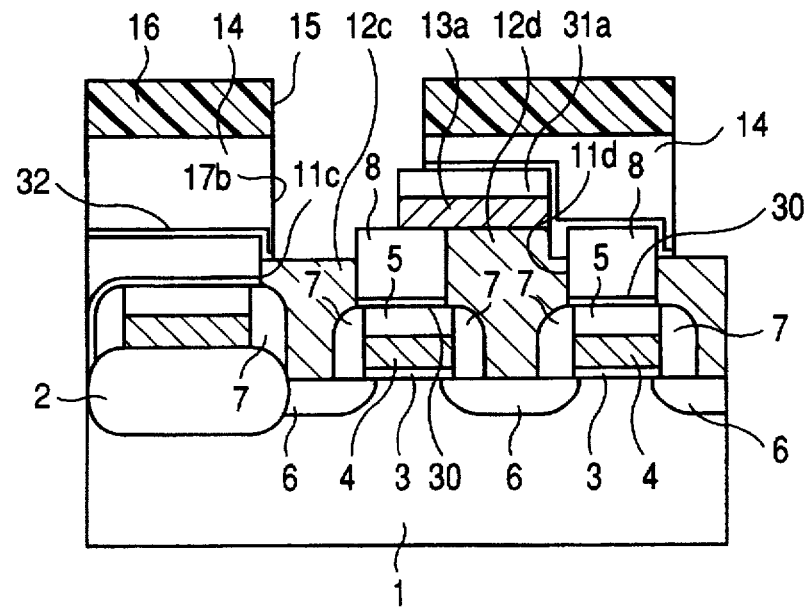
FIG. 13 is a sectional view of a twelfth process step of the manufacturing of the semiconductor device in the first embodiment.

As shown in FIG. 13, the silicon oxynitride or silicon oxynitride film 32 is dry-etched by RIE techniques using $CF_4$ gas or the like, and the contact hole 17b as the third hole is formed.

Figure 14:
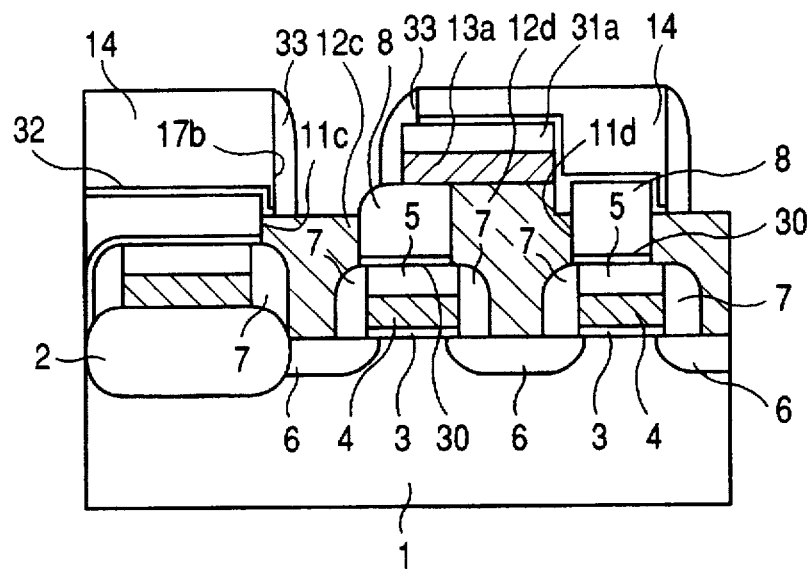
FIG. 14 is a sectional view of a thirteenth process step of the manufacturing of the semiconductor device in the first embodiment.

As shown in FIG. 14, after removing the resist pattern 16, silicon dioxide is formed on the silicon dioxide film 14 and in the contact hole 17b by CVD techniques, and the first electric conductor 12c is exposed by etching back techniques in the contact hole 17b, forming the side wall spacer 33 in the contact hole 17b.

Figure 15:
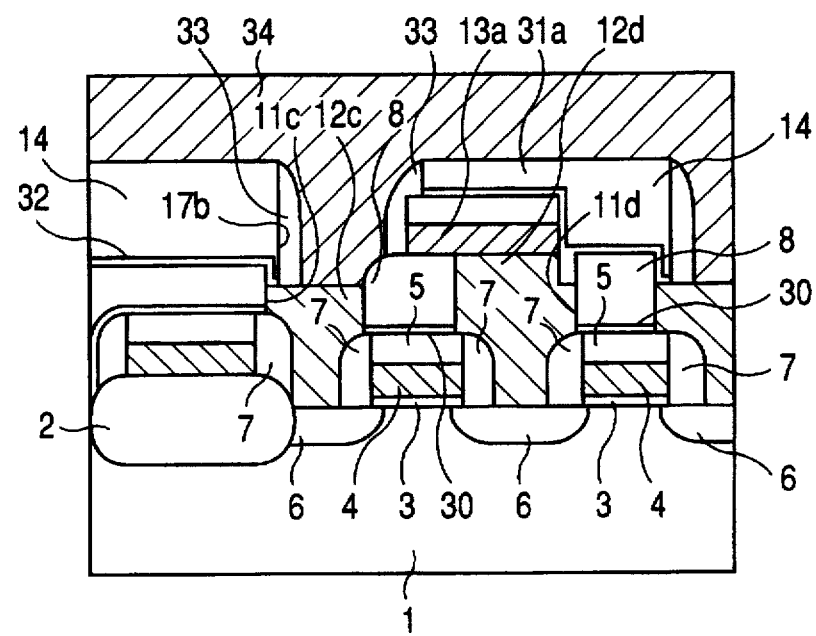
FIG. 15 is a sectional view of a fourteenth process step of the manufacturing of the semiconductor device in the first embodiment.
Figure 16:
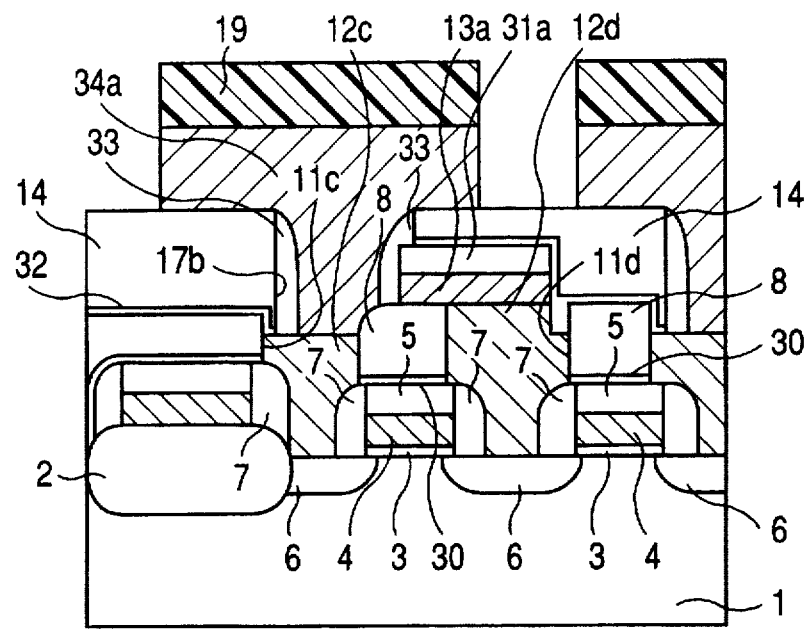
FIG. 16 is a sectional view of a fifteenth process step of the manufacturing of the semiconductor device in the first embodiment.

As shown in FIG. 15, a polysilicon layer 34 is formed on the surface by CVD techniques. The density of phosphorus in the polysilicon layer 34 is $1 \times 10^{19} \sim 8 \times 10^{20}/cm^3$. After forming the polysilicon layer 34, as shown in FIG. 16, and coating photoresist upon it, a resist pattern 19 is formed by a photolithography process. The polysilicon layer 34 is etched by the resist pattern 19 as a mask, and the lower electrode 34a of the capacitor is formed on the silicon dioxide film 14 and in the contact hole 17b except for the side wall spacer 33.

Figure 17:
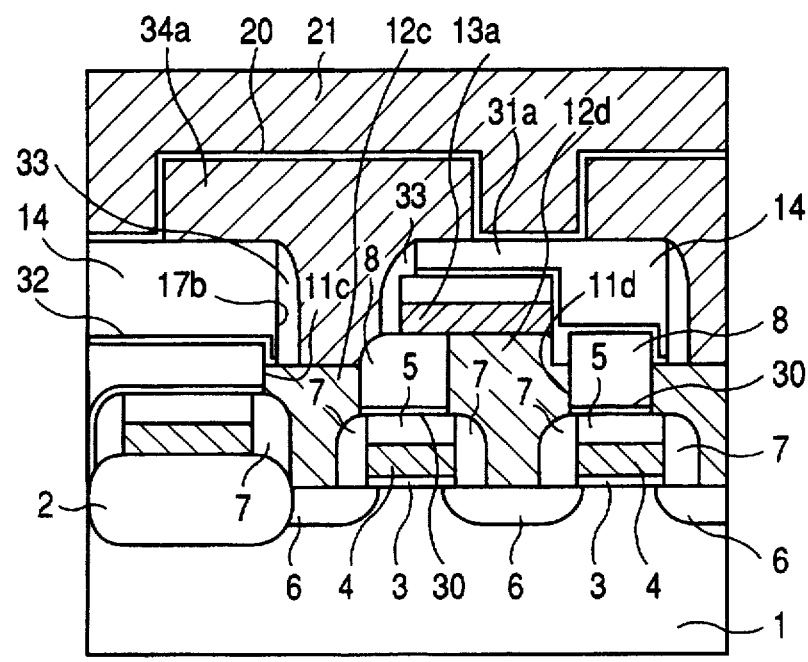
FIG. 17 is a sectional view of a sixteenth process step of the manufacturing of the semiconductor device in the first embodiment.
Figure 18:
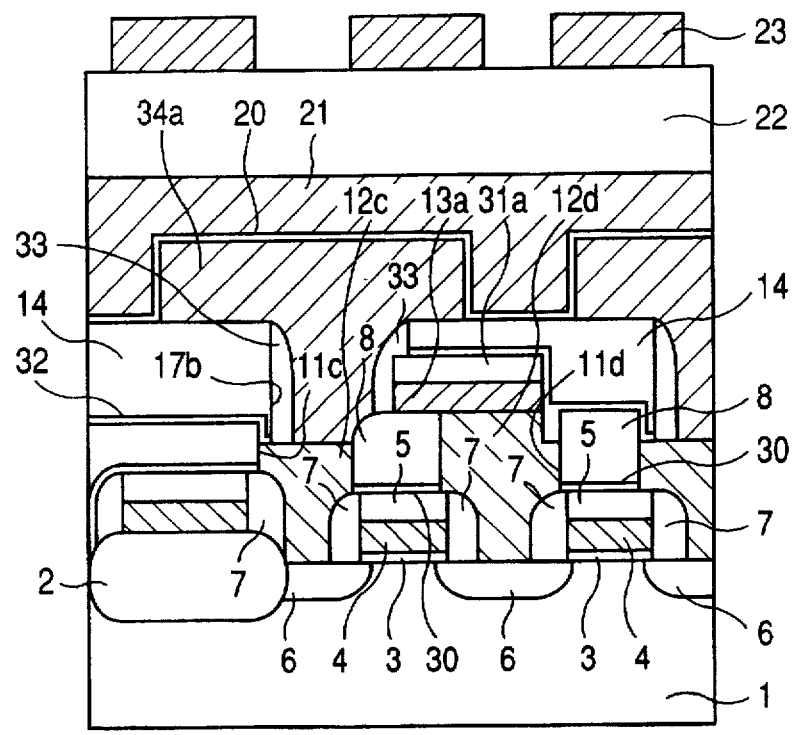
FIG. 18 is a sectional view of a seventeenth process step of the manufacturing of the semiconductor device in the first embodiment.

As shown in FIG. 17, after removing the resist pattern 19, the induced electricity layer 20 comprising silicon nitride and the upper electrode 21 comprising polysilicon are formed by CVD techniques. The insulating film layer 22 (silicon dioxide film layer) is formed on the upper electrode 21 by CVD techniques as shown in FIG. 18. A contact hole (not shown) is formed in the insulating film layer 22 for exposing internal wiring, and the wiring layer 23 comprising AlCu or AlSiCu is formed on the insulating film layer 22.

According to the semiconductor device and the method of manufacturing thereof in this embodiment, when the contact hole 11d is formed in the silicon dioxide film 8 as the first insulating film layer, the second electric conductor 12d which electrically connects the bit line 13a and the silicon substrate 1 is formed by self-alignment with respect to the gate electrode 4, because the etching speed of the silicon dioxide film 8 is faster than that of the silicon nitride ($Si_3N_4$) or silicon oxynitride film (silicon) 30 as the first insulating film layer.

Further, when the contact hole 11c is formed in the silicon dioxide film 8, the first electric conductor 12c which connects the lower electrode 34a to the silicon substrate 1 electrically is formed by self-alignment with respect to the gate electrode 4, because the etching speed of the silicon dioxide film 8 is faster than that of the silicon nitride ($Si_3N_4$) or silicon oxynitride film (silicon) 30 as the first insulating film layer.

Also, when the contact hole 17 formed, the lower electrode 34a is formed by self-alignment with respect to the bit line 13a, because the etching speed of the silicon dioxide film 14 is faster than that of the silicon nitride ($Si_3N_4$) or silicon oxynitride film (silicon) 32 and the side wall spacer 33 is formed in the contact hole 17b.

Therefore, in a high integration DRAM which needs a reduced-size memory cell, the semiconductor device can be obtained without any short circuit between the bit line 13a and the gate electrode 4 and without any short circuit between the lower electrode 34a and the bit line 13a or the gate electrode 4, respectively.

(Second Embodiment)

Next, a second embodiment of the present invention is described with reference to FIG. 19.

Figure 19:
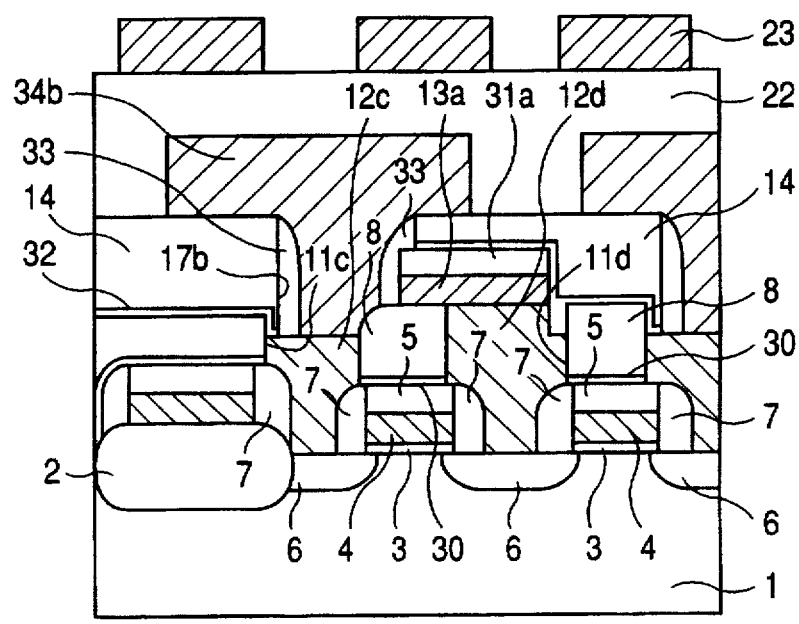
FIG. 19 is a sectional view of a semiconductor device of a second embodiment of the present invention.

FIG. 19 shows a sectional view of a semiconductor device of the second embodiment of the present invention. In the first embodiment, a capacitor is formed on the silicon dioxide film 14 and in the contact hole 17b except for the side wall spacer 33. In the second embodiment, as shown in FIG. 19, a wiring layer 34b as a third wiring layer is formed instead of the capacitor. The wiring layer 34b comprises polysilicon and phosphorus. The density of phosphorus is $1 \times 10^{19} \sim 8 \times 10^{20}/cm^3$. When a high integration logic circuit device is formed, a reduced-size circuit device can be obtained without any short circuit between the wiring layer 34b and the bit line 13a or the gate electrode 4.

(Third Embodiment)

A third embodiment of the present invention is described with reference to FIGS. 20–29.

Figure 20:
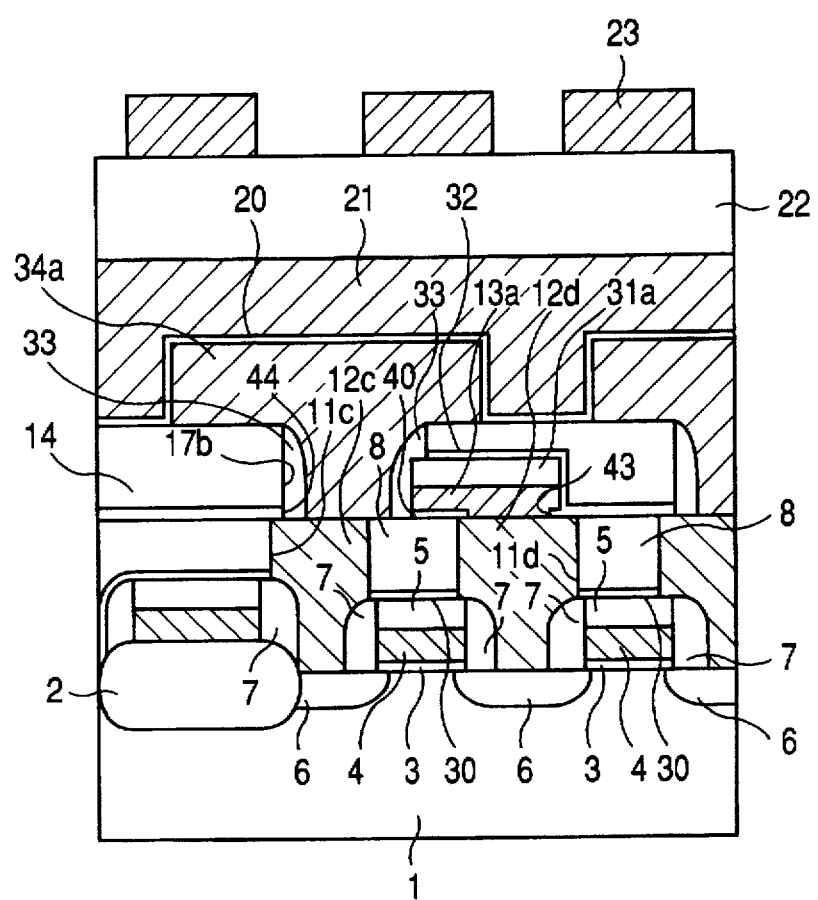
FIG. 20 is a sectional view of a semiconductor device of a third embodiment of the present invention.

FIG. 20 shows a sectional view of a semiconductor device of the third embodiment of the present invention. The bit line 13a and the second insulating film layer (the silicon dioxide film 14, the silicon nitride or silicon oxynitride film 32) are formed on the first insulating film layer (the silicon nitride or silicon oxynitride film 30, the silicon dioxide film 8) as in the first embodiment. However, in the third embodiment, the semiconductor device includes a contact hole 43 as a fourth hole, a contact hole 44 as a fifth hole and a silicon nitride or silicon oxynitride film 40 as a third insulating film layer which is formed the first insulating film layer and the bit line 13a or the second insulating film layer. The etching speed of the silicon nitride film or silicon oxynitride film 40 is slower than that of the bit line 13a. The surface of the first electric conductor 12c and a part of the surface of the second electric conductor 12d are not overetched, unlike the first embodiment. The other structures of FIG. 20 are the same as those of the first embodiment. The heights of the upper surface of the first electric conductor 12c and the second electric conductor 12d from the main surface of the silicon substrate 1 are substantially equal to the height of upper surface of the silicon dioxide film 8 from the main surface of the silicon substrate 1.

FIGS. 21–29 show a sectional view of a method of manufacturing of the semiconductor device in FIG. 20.

Figure 21:
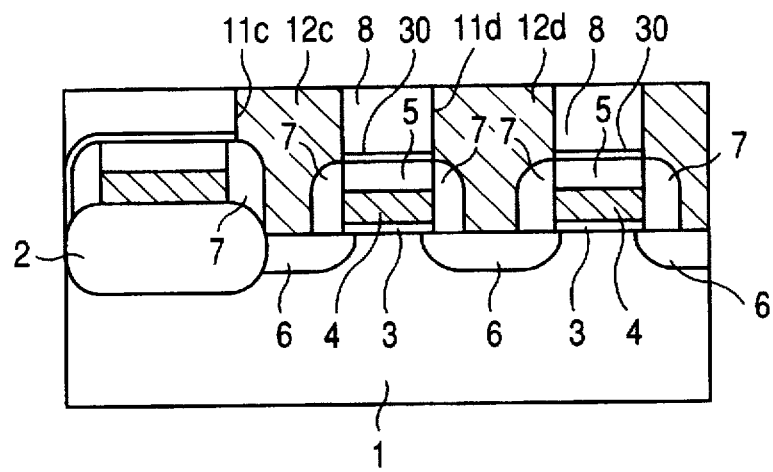
FIG. 21 is a sectional view of a first process step of a manufacturing of the semiconductor device in the third embodiment.
Figure 22:
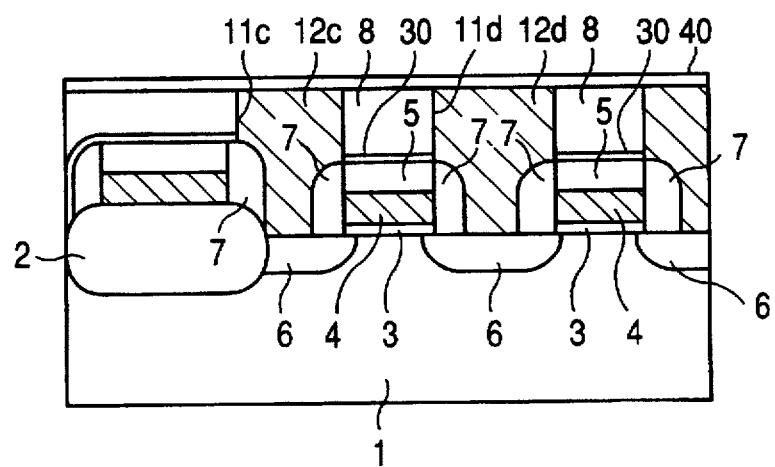
FIG. 22 is a sectional view of a second process step of the manufacturing of the semiconductor device in the third embodiment.
Figure 23:
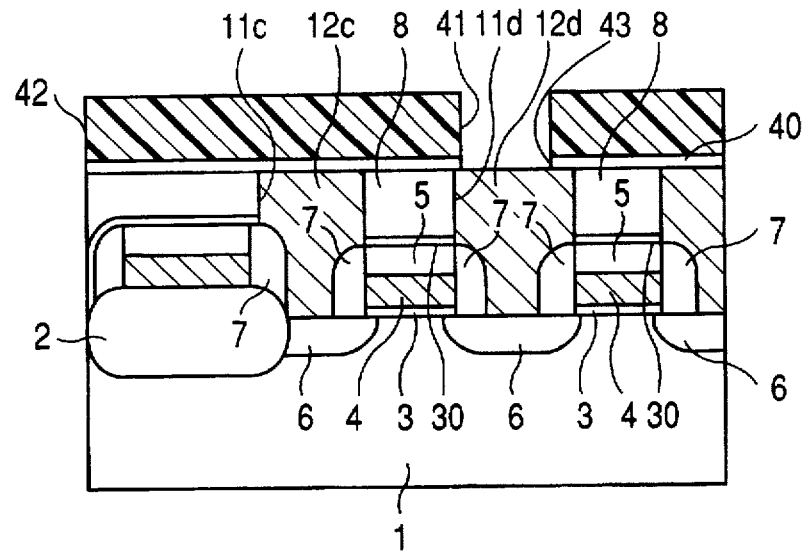
FIG. 23 is a sectional view of a third process step of the manufacturing of the semiconductor device in the third embodiment.

As shown in FIG. 21, according to the same manufacturing process as the first embodiment, the first and the second electric conductors 12c and 12d are formed respectively in the contact holes 11c and 11d which are formed in the first insulating film layer. As shown in FIG. 22, the third insulating film layer is formed by CVD techniques. The thickness of the silicon nitride or silicon oxynitride film 40 is 50~1000 Å. As shown in FIG. 23, photoresist is coated on the silicon nitride or silicon oxynitride film 40, and a resist pattern 42 having an opening portion 41 is formed by a photolithography process. The silicon nitride or silicon oxynitride film 40 etched by the resist pattern 42 as a mask. The upper surface of the second electric conductor 12d is exposed according to the contact hole 43.

Figure 24:
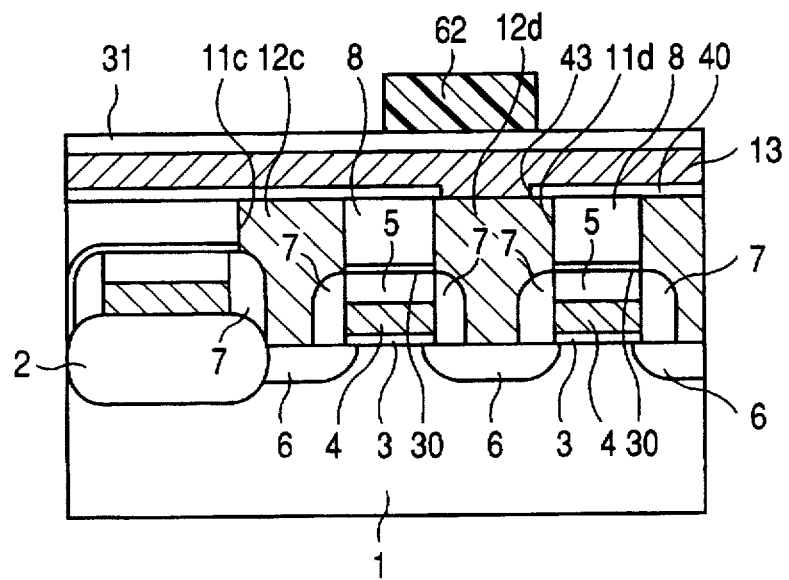
FIG. 24 is a sectional view of a fourth process step of the manufacturing of the semiconductor device in the third embodiment.

As shown in FIG. 24, the electric conductor layer 13 which comprises a chemical compound of tungsten (W) and silicon (Si) or a chemical compound of titanium (Ti) and silicon (Si) is formed by CVD techniques or sputtering techniques on the silicon nitride or silicon oxynitride film 40 and the second electric conductor 12d. The insulating film layer 31 which comprises silicon dioxide ($SiO_2$) is formed by CVD techniques on the silicon nitride film 40 or the silicon oxynitride film 40 and the second electrode 12d. The thickness of the insulating film layer 31 is 300~3000 Å. After forming the photoresist and using the photolithography process, the resist pattern 62 is formed on the insulating film layer 31.

Figure 25:
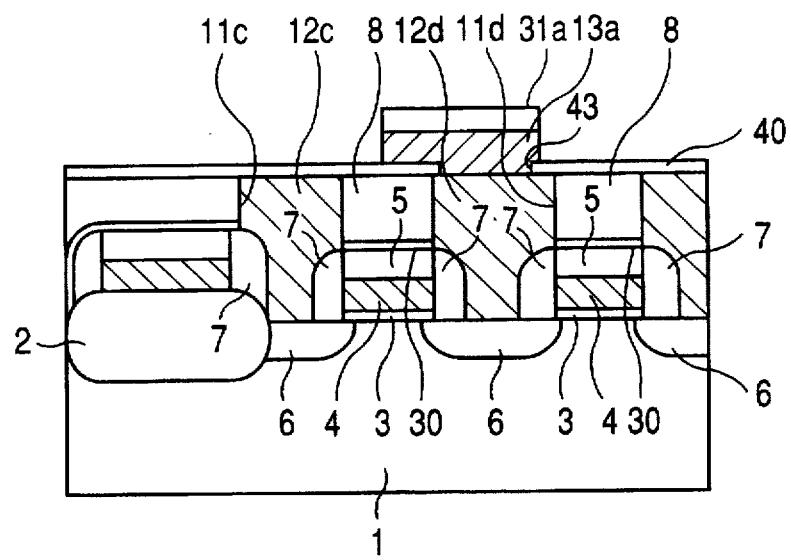
FIG. 25 is a sectional view of a fifth process step of the manufacturing of the semiconductor device in the third embodiment.

As shown in FIG. 25, the bit line 13a as the second wiring layer having the insulating film layer 31a is formed by using an etching process to the insulating film layer 31 and the electric conductor layer 13 according to the resist pattern 62 as the mask. The surfaces of the first electric conductor 12c and the second electric conductor 12d are not over etched unlike the first embodiment, because the silicon nitride or silicon oxynitride film 40 is formed on the first electric conductor 12c and the second electric conductor 12d at this time. Then, the resist pattern 62 is removed.

Figure 26:
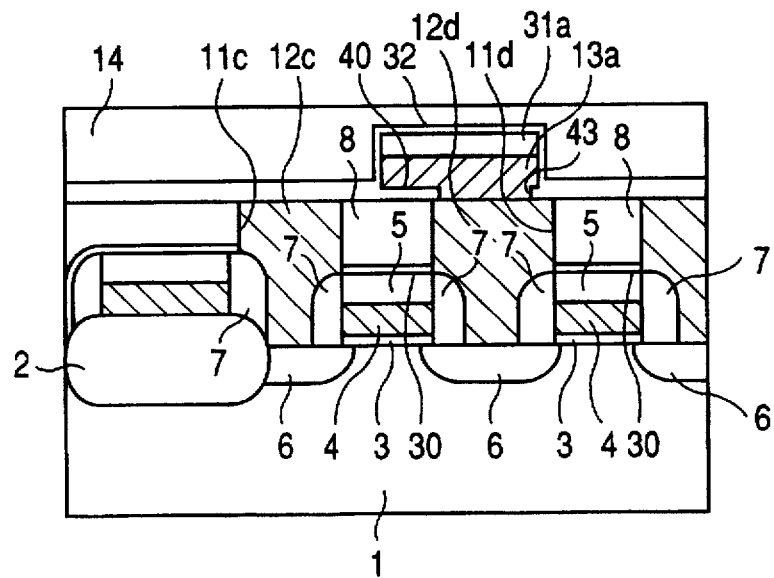
FIG. 26 is a sectional view of a sixth process step of the manufacturing of the semiconductor device in the third embodiment.

As shown in FIG. 26, the silicon nitride film 32 or the silicon oxynitride film 32 as the lower layer of the second insulating film layer is formed on the surface by CVD techniques. The thickness of the lower layer of the second insulating film layer is 50~1000 Å. The silicon dioxide film 14 as the upper layer of the second insulating film layer is formed by CVD techniques. The thickness of the upper layer of the second insulating film layer is 250~5000 Å.

Figure 27:
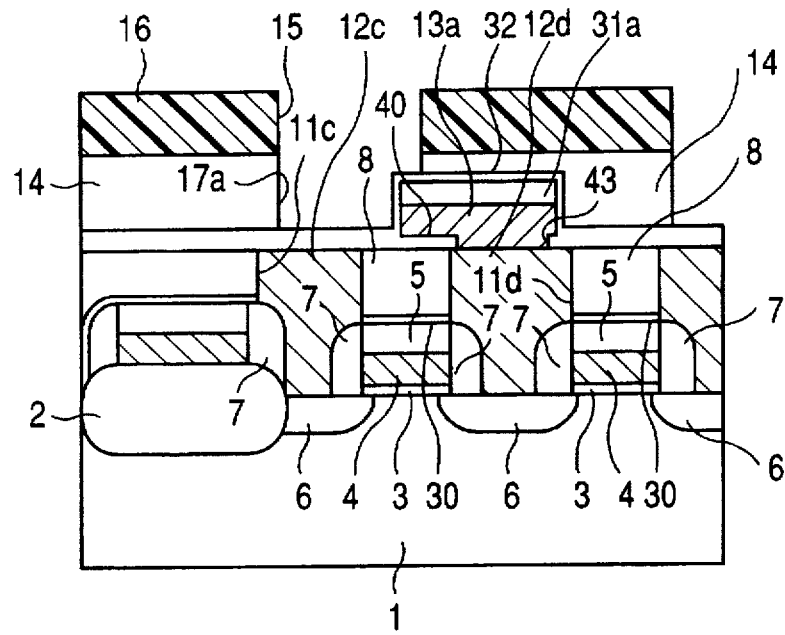
FIG. 27 is a sectional view of a seventh process step of the manufacturing of the semiconductor device in the third embodiment.

As shown in FIG. 27, photoresist is coated on the silicon dioxide film 14, and the resist pattern 16 having an opening portion 15 is formed by the photolithography process. The etching speed of the silicon dioxide film 14 is faster than that of the silicon oxynitride or silicon oxynitride film 32 as the lower layer of the second insulating film layer. Using the etching process, the silicon dioxide film 14 is dry-etched by RIE techniques, and the contact hole 17a is formed.

Figure 28:
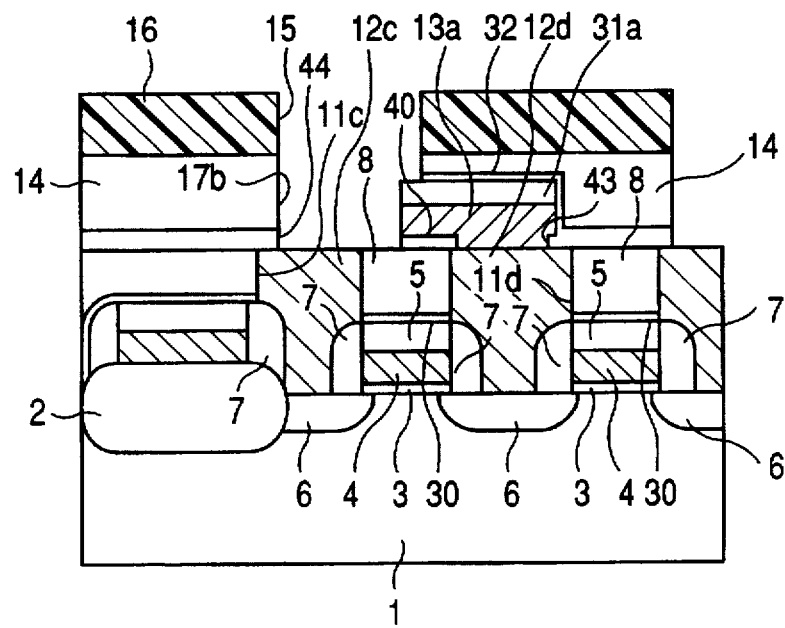
FIG. 28 is a sectional view of an eighth process step of the manufacturing of the semiconductor device in the third embodiment.

As shown in FIG. 28, the silicon oxynitride or silicon oxynitride film 32 and the silicon nitride or silicon oxynitride film 40 as the third insulating film layer are dry-etched by RIE techniques using $CF_4$ gas or the like, and the contact hole 17b as the third hole and the contact hole 44 as the fifth hole are formed in order.

Figure 29:
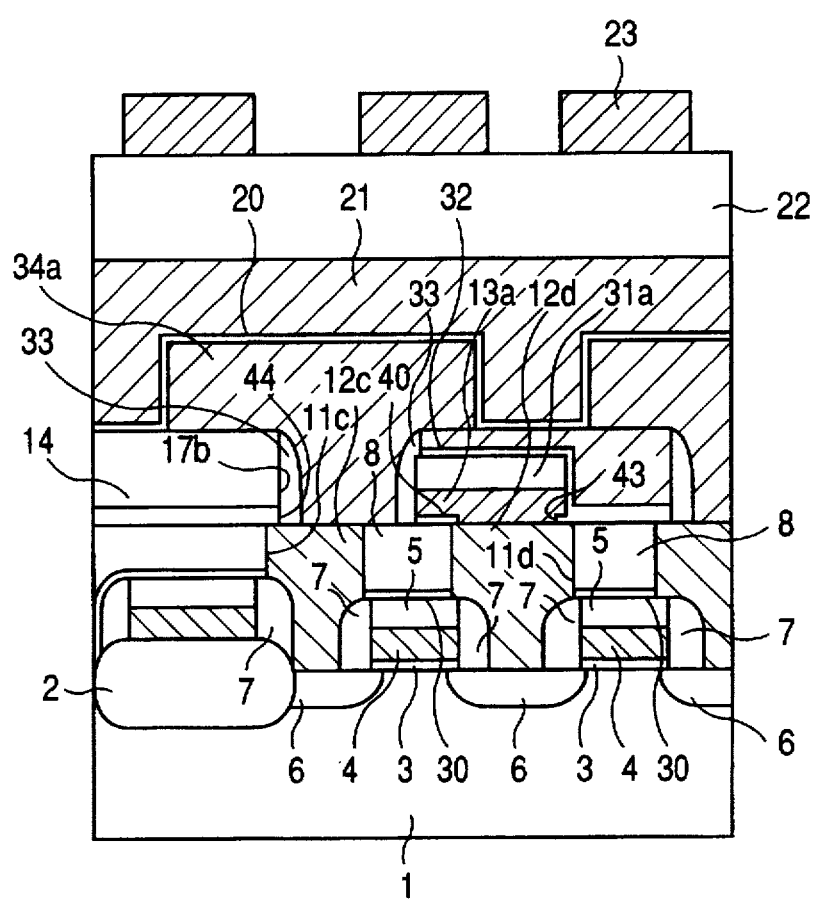
FIG. 29 is a sectional view of a ninth process step of the manufacturing of the semiconductor device in the third embodiment.

The side wall spacer 33, the lower electrode 34a, the induced electricity layer 20, the upper layer 21, the insulating film layer 22 and the wiring layer 23 are formed according to a process like the one in the first embodiment, and the semiconductor device is formed as shown in FIG. 29.

According to the semiconductor device and the method of manufacturing thereof in the third embodiment, when the bit line 13a is formed by the etching of the electric conductor layer 13, the surfaces of the first electric conductor 12c and the second electric conductor 12d are not over etched, because the etching speed of the silicon nitride or silicon oxynitride film 40 which is formed on the first electric conductor 12c and the second electric conductor 12d is slower than that of the bit line 13a.

Therefore, good electric resistance characteristics between the lower electrode 34a and the silicon substrate 1 can be obtained, compared to the first embodiment, because the electric resistance between the lower electrode 34a and the silicon substrate 1 decreases with the increase of the cross-sectional area of the first electric conductor 12c in the contact hole 11c, as shown in FIG. 20.

Furthermore, the third wiring layer may be formed instead of the capacitor like the second embodiment. The third wiring layer comprises polysilicon containing phosphorus of $1 \times 10^{19} \sim 8 \times 10^{20}/cm^3$. In this case, the semiconductor device can be obtained with the same effect as the third embodiment.

(Fourth Embodiment)

A fourth embodiment of the present invention is described with reference to FIGS. 30-37 as follows.

Figure 30:
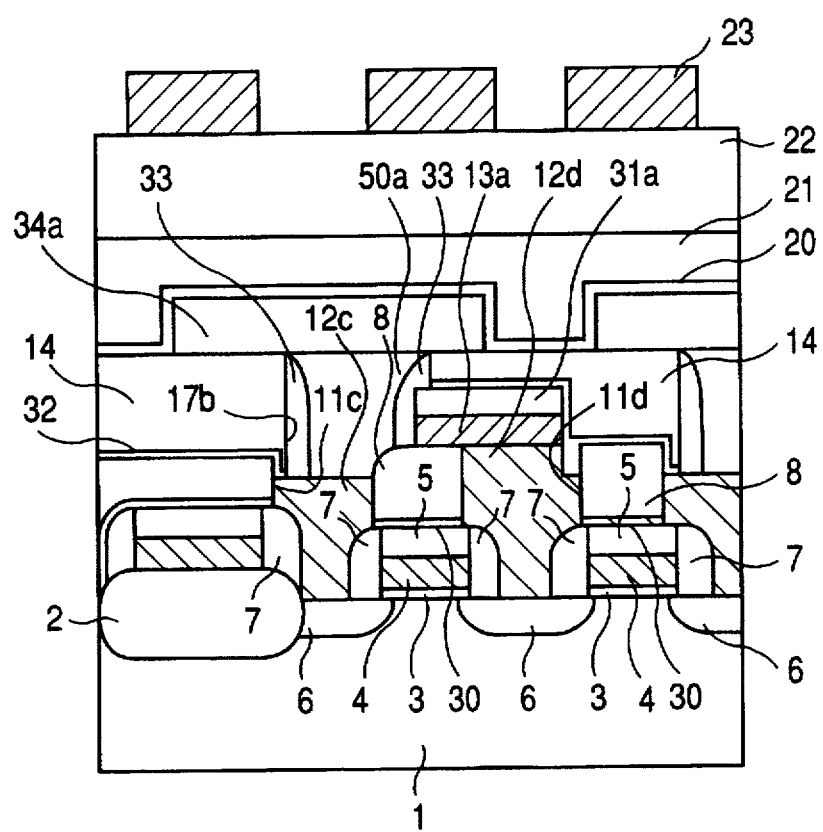
FIG. 30 is a sectional view of a semiconductor device of a fourth embodiment of the present invention.

FIG. 30 shows a sectional view of a semiconductor device of the fourth embodiment of the present invention. In the first embodiment, the lower electrode 34a of the capacitor is formed on the silicon dioxide film 14 and in the contact hole 17b except for the side wall spacer 33, and the induced electricity layer 20 comprising silicon nitride and the upper electrode 21 comprising polysilicon are formed on the lower electrode 34a. The lower electrode 34a comprises the polysilicon in the first embodiment. In the fourth embodiment, as shown in FIG. 30, a capacitor comprising a high dielectric constant material which requires a metal or a metal compound in a electrode is formed on the silicon dioxide film 14. A third electric conductor 50a comprising another material different from the material of the lower electrode 34a is formed in the contact hole 17b except for the side wall spacer 33. The other structures of FIG. 30 are the same as those of the first embodiment.

FIGS. 31-37 show a sectional view of a method of manufacturing of the semiconductor device in FIG. 30.

Figure 31:
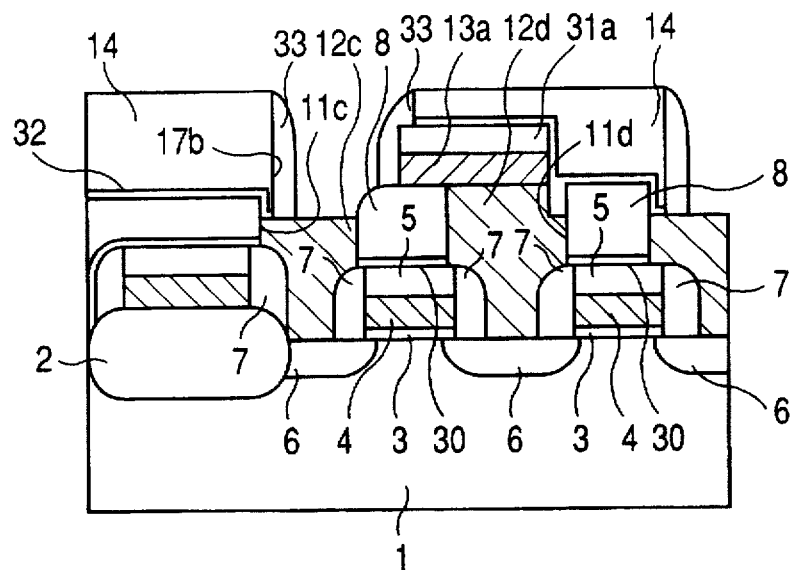
FIG. 31 is a sectional view of a first process step of a manufacturing of the semiconductor device in the fourth embodiment.
Figure 32:
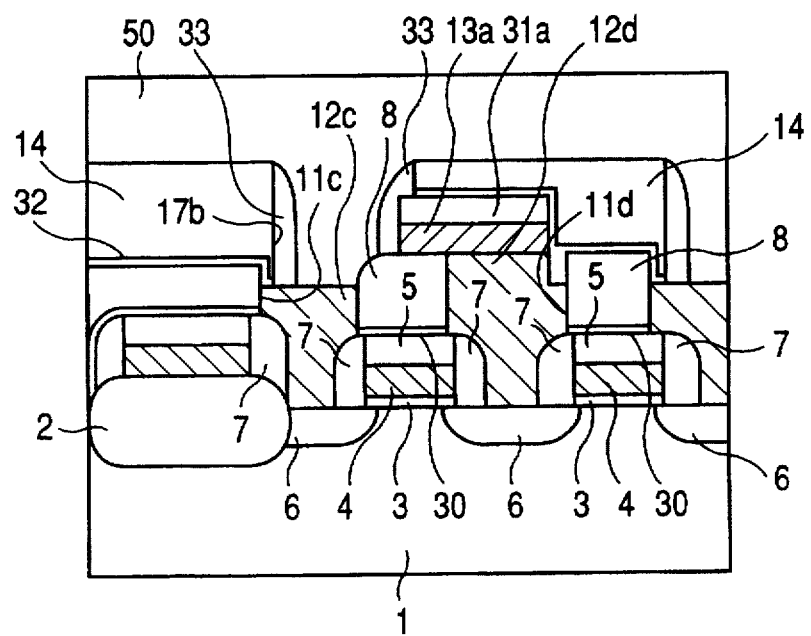
FIG. 32 is a sectional view of a second process step of the manufacturing of the semiconductor device in the fourth embodiment.

As shown in FIG. 31, through the same process as of the first embodiment, the side wall spacer 33 is formed in the contact hole 17b. As shown in FIG. 32, a electric conductor layer 50 comprising a compound of titanium and nickel or oxygen, a compound of tantalum and nickel or oxygen or a compound of tungsten and nickel or oxygen is formed on the surface by CVD techniques. These compounds have a diffusion control effective for the metal or the metal compound as the lower electrode of capacitor.

Figure 33:
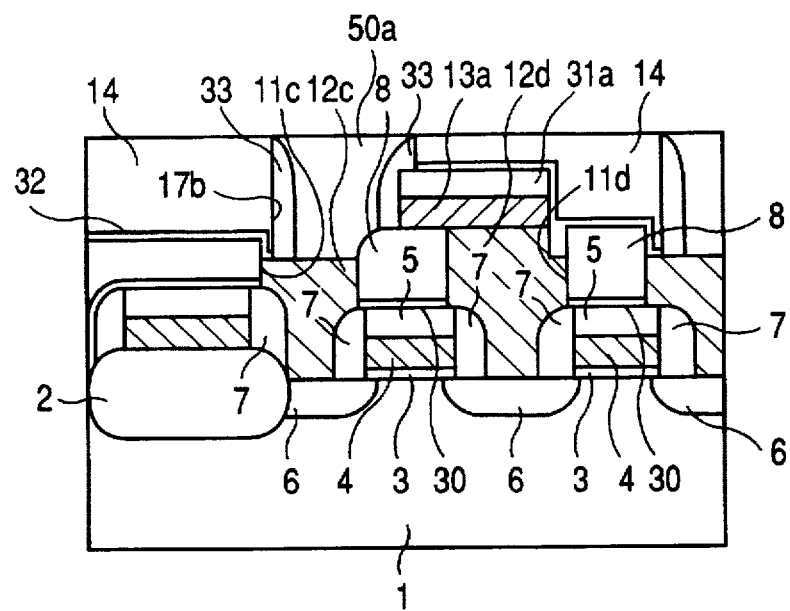
FIG. 33 is a sectional view of a third process step of the manufacturing of the semiconductor device in the fourth embodiment.

As shown in FIG. 33, the electric conductor layer 50 which is formed on the upper layer of the silicon dioxide film 14 is removed by an etching back technique applied to all the surface of the conductor layer 50. The third electric conductor 50a is formed in the contact hole 17b except for the side wall spacer 33. The third electric conductor 50a has the diffusion control effective for the metal or the metal compound as the lower electrode of capacitor.

Figure 34:
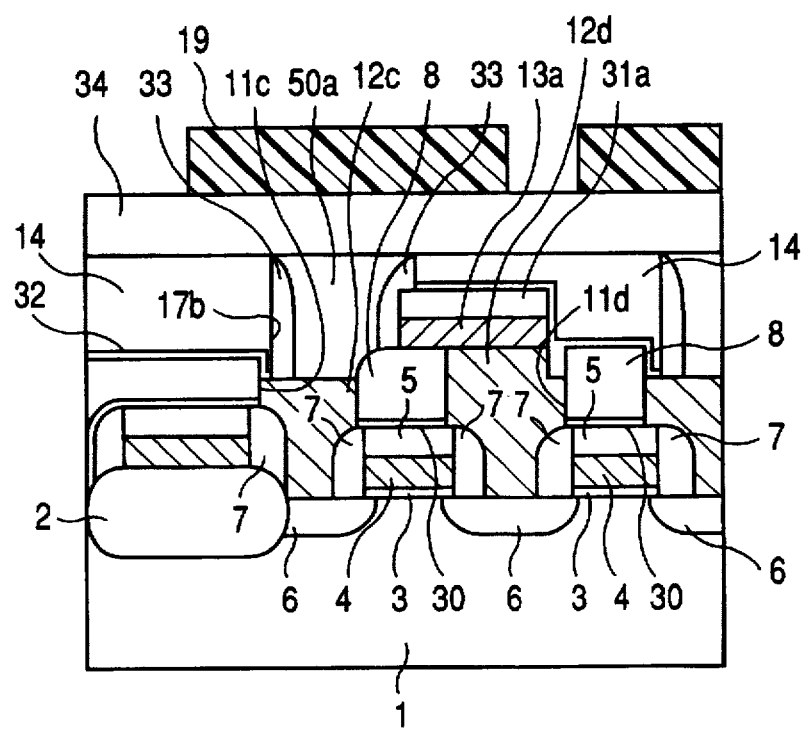
FIG. 34 is a sectional view of a fourth process step of the manufacturing of the semiconductor device in the fourth embodiment.

As shown in FIG. 34, a electric conductor layer 34 is formed on the silicon dioxide film 14 and the third electric conductor 50a by CVD techniques or sputtering techniques. The electric conductor layer 34 comprises platinum, ruthenium (Ru), ruthenium dioxide (RuO$_2$), tungsten, titanium, or tantalum. The thickness of the electric conductor layer 34 is 200-10000 Å. After coating photoresist on the electric conductor layer 34, the resist pattern 19 as the mask is formed by the photolithography process.

Figure 35:
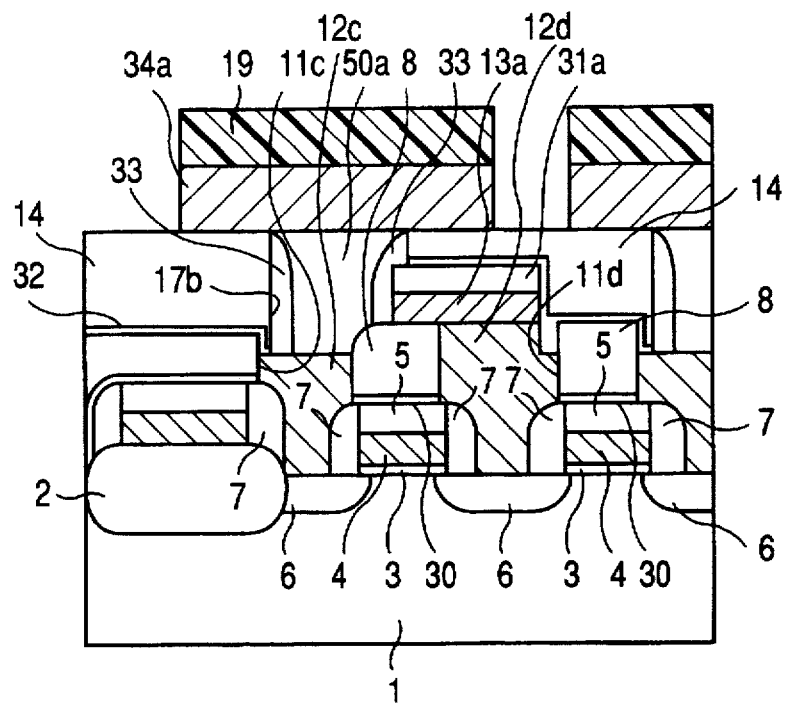
FIG. 35 is a sectional view of a fifth process step of the manufacturing of the semiconductor device in the fourth embodiment.

As shown in FIG. 35, according to the resist pattern as the mask, the electric conductor layer 34 is dry-etched, and the lower layer electrode 34a is formed. A gas for the dry-etching uses oxygen, argon, helium, carbon dioxide or chlorine.

Figure 36:
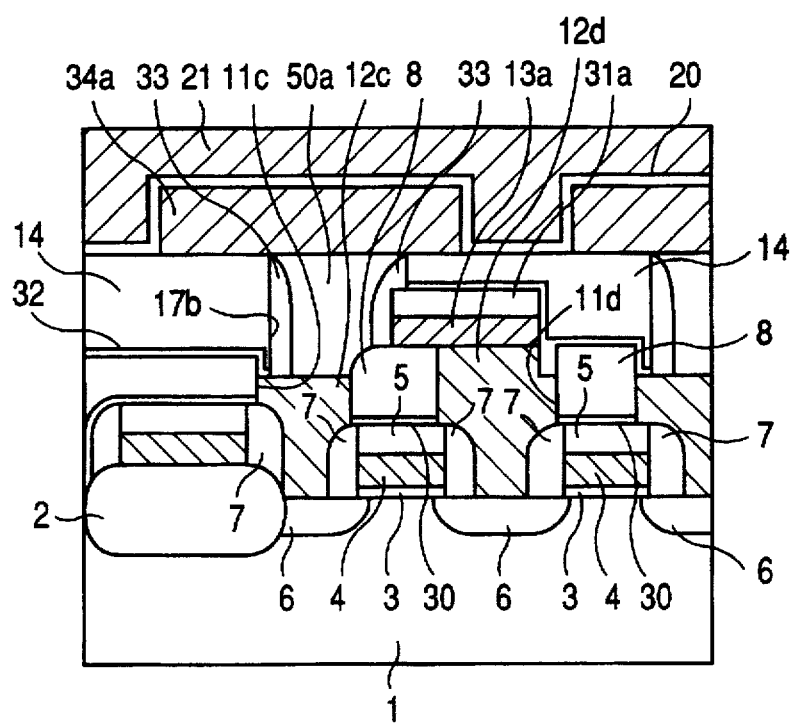
FIG. 36 is a sectional view of a sixth process step of the manufacturing of the semiconductor device in the fourth embodiment.
Figure 37:
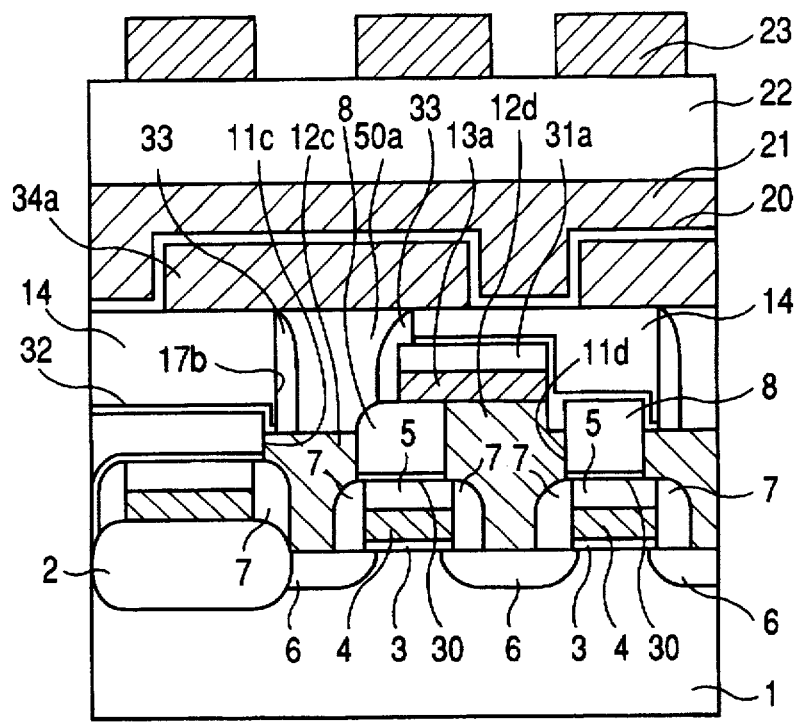
FIG. 37 is a sectional view of a seventh process step of the manufacturing of the semiconductor device in the fourth embodiment.

As shown in FIG. 36, after removing the resist pattern 19, the high induced electricity film 20 and the upper electrode 21 are formed by CVD techniques or sputtering techniques. The high induced electricity film 20 comprises STO, BST, or PZT. The upper electrode 21 comprises platinum, ruthenium (Ru), ruthenium dioxide (RuO$_2$), tungsten, titanium, or tantalum. Then the insulating film layer 22 (silicon dioxide film layer) is formed on the upper electrode 21 by CVD techniques. The contact hole (not shown) is formed in the insulating film layer 22 for exposing internal wiring, and the wiring layer 23 comprising AlCu or AlSiCu is formed. Therefore, the semiconductor device is formed as shown in FIG. 37.

According to the semiconductor device and the method of manufacturing thereof in the fourth embodiment, the semiconductor device can comprise a memory cell having a high capacitance in full detail without deterioration of the device characteristics according to the diffusion of the metal or the metal compound into the silicon substrate 1. This is because the capacitor with the high dielectric constant material requiring the metal or the metal compound for the electrode and the third electric conductor 50a which comprises the compound for controlling the diffusion of the metal or the metal compound of the lower electrode 34a are formed.

Therefore, the semiconductor device can obtain high capacitance and high integration in the fourth embodiment.

The first electric conductor 12c and the second electric conductor 12d is overetched when the bit line 13a is formed in the fourth embodiment.

However, it may be formed like the third embodiment. When the bit line 13a is formed by the etching process, the first electric conductor 12c and the second electric conductor 12d may be formed so as not to over etch according to the formation of the silicon nitride film 40 or the silicon oxynitride film 40 on the first electric conductor 12c and the second electric conductor 12d. This is due to the fact that the etching speed of the silicon nitride or silicon oxynitride film 40 which is formed on the first electric conductor 12c and the second electric conductor 12d is slower than that of the bit line 13a. The above semiconductor device can obtain the same effectiveness as the fourth embodiment.

(Fifth Embodiment)

A fifth embodiment of the present invention is described with reference to FIG. 38 as follows.

Figure 38:
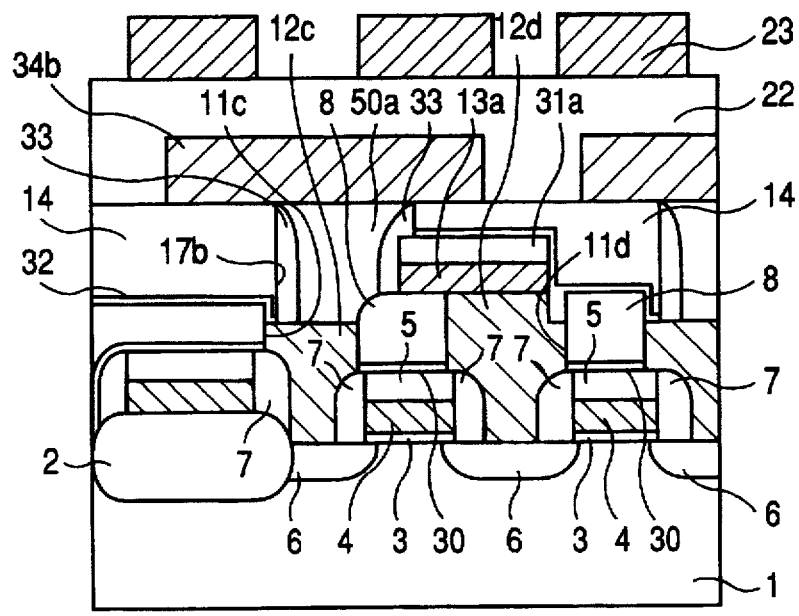
FIG. 38 is a sectional view of a semiconductor device of a fifth embodiment of the present invention.

FIG. 38 shows a sectional view of a semiconductor device of the fifth embodiment of the present invention. The capacitor is formed on the silicon dioxide film 14 and the third electric conductor 50a in the fourth embodiment, but in the fifth embodiment, the third wiring layer 34b which comprises platinum, ruthenium (Ru), ruthenium dioxide (RuO$_2$), tungsten, titanium, or tantalum is formed instead of the capacitor as shown FIG. 38. The manufacturing process of the semiconductor device of high capacitance and high integration having the logic circuit can be decreased with full width, because the logic circuit which comprises high capacitance in full detail can be formed by the same process as that which forms the memory cell having the capacitor with the high dielectric constant material in the fourth embodiment.

In the semiconductor device of the fifth embodiment, the first electric conductor 12c and the second electric conductor 12d is overetched when the bit line 13a is formed. As described in the third embodiment, when the bit line 13a is formed by the etching process, the first electric conductor 12c and the second electric conductor 12d may be formed so as not to over etch by forming the silicon nitride film 40 or the silicon oxynitride film 40 on the first electric conductor 12c and the second electric conductor 12d, because the etching speed of the silicon nitride or silicon oxynitride film 40 which is formed on the first electric conductor 12c and the second electric conductor 12d is slower than that of the bit line 13a. The above semiconductor device can be obtained with the same effectiveness as the fifth embodiment.

(Sixth Embodiment)

A sixth embodiment of the present invention is described with reference to FIGS. 39-44 as follows.

Figure 39:
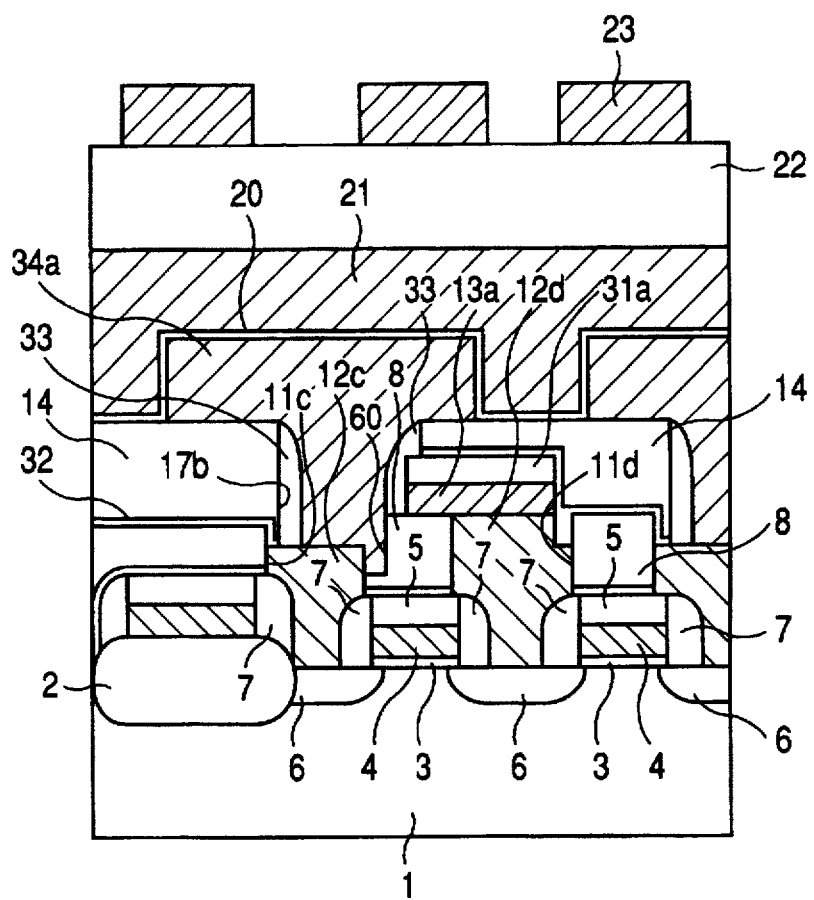
FIG. 39 is a sectional view of a semiconductor device of a sixth embodiment of the present invention.

FIG. 39 shows a sectional view of the semiconductor device of the sixth embodiment. The lower electrode 34a of the capacitor which is formed on the silicon dioxide film 14 and in the contact hole 17b except for the side wall spacer 33 is connected to a part of a upper surface of the first electric conductor 12c in the contact hole 11c in the first embodiment, and, in addition to the first embodiment, the lower electrode 34a is connected to a part of a side surface of the first electric conductor 12c. The other structures are the same as those of the first embodiment.

FIGS. 40-44 show a sectional view of a method of manufacturing of the semiconductor device in FIG. 39.

Figure 40:
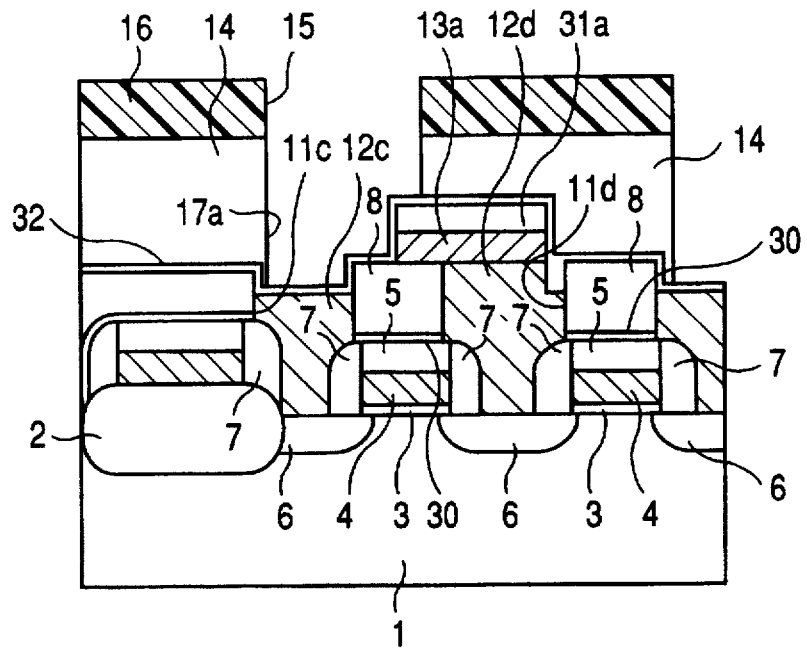
FIG. 40 is a sectional view of a first process step of a manufacturing of the semiconductor device in the sixth embodiment.

As shown in FIG. 40, through the same process as the first embodiment, photoresist is coated on the silicon dioxide film 14, and the resist pattern 16 having the opening portion 15 is formed by a photolithography process. The etching speed of the silicon dioxide film 14 is faster than that of the silicon nitride or silicon oxynitride film 32 as the lower layer of the second insulating film layer. Using the etching process, the silicon dioxide film 14 is dry etched by RIE techniques, forming the contact hole 17a.

Figure 41:
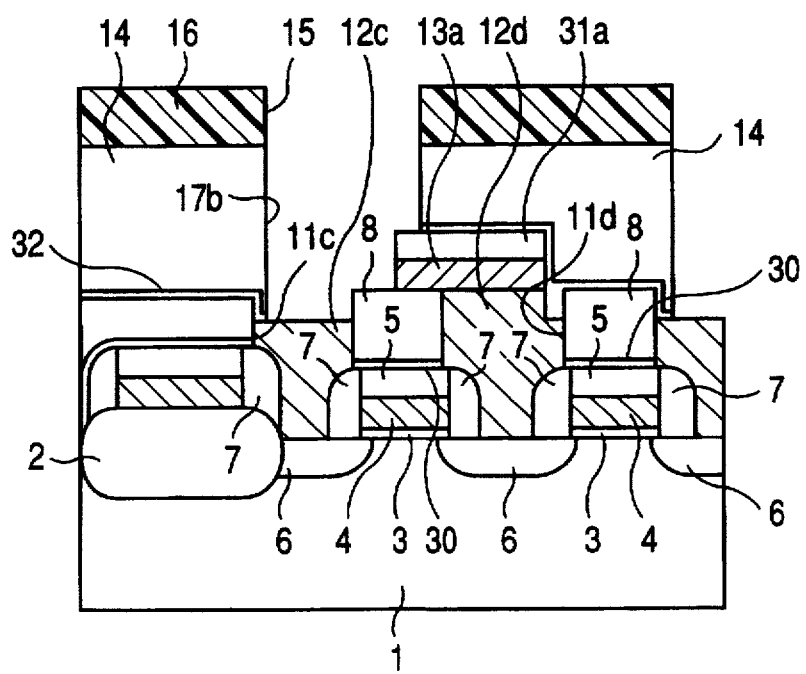
FIG. 41 is a sectional view of a second process step of the manufacturing of the semiconductor device in the sixth embodiment.

As shown in FIG. 41, the silicon oxynitride film 32 or the silicon oxynitride film 32 is dry etched by RIE techniques using $CF_4$ gas and the like, and the contact hole 17b is formed.

Figure 42:
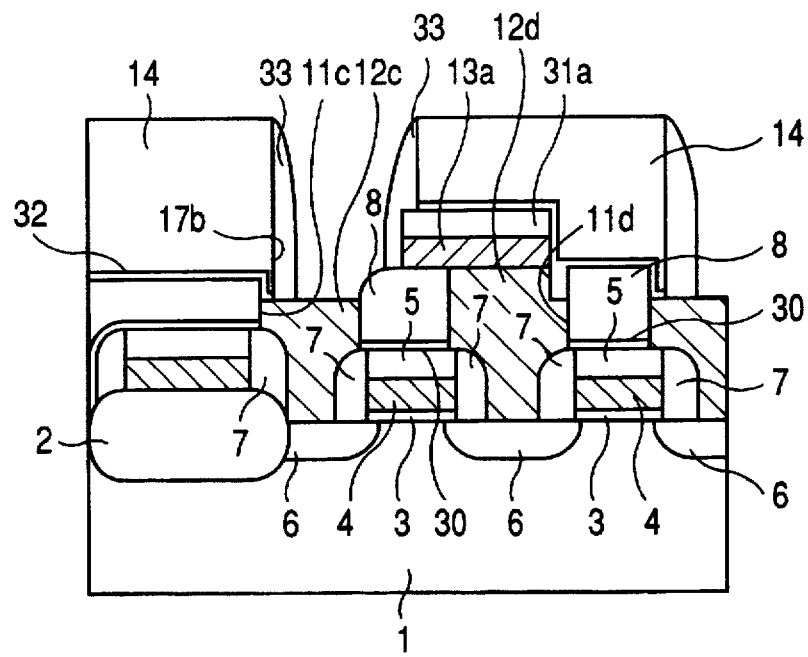
FIG. 42 is a sectional view of a third process step of the manufacturing of the semiconductor device in the sixth embodiment.

As shown in FIG. 42, after removing the resist pattern 16, silicon dioxide is formed on the silicon dioxide film 14 and in the contact hole 17b by CVD techniques. The first electric conductor 12c is exposed in the contact hole 17b and the side wall spacer 33 is formed in the contact hole 17b by etching back techniques.

Figure 43:
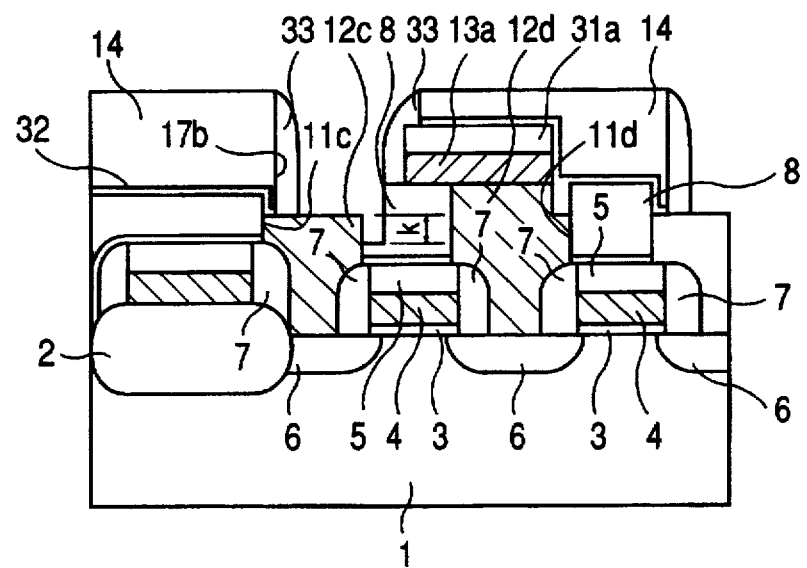
FIG. 43 is a sectional view of a fourth process step of the manufacturing of the semiconductor device in the sixth embodiment.

As shown in FIG. 43, all the surfaces of the silicon dioxide film 14 is etched further, and a part of the silicon dioxide film 8 as the upper layer of the first insulating film layer which contacts the first electric conductor 12c is over etched to expose part of the side surface of the first electric conductor 12c. The depth k from the top surface of the first electric conductor 12c is 500–3000 Å. At this time, the silicon dioxide film 14 as the upper layer of the second insulating film layer and the side wall spacer 33 are slightly overetched, but the bit line 13a never is exposed.

Figure 44:
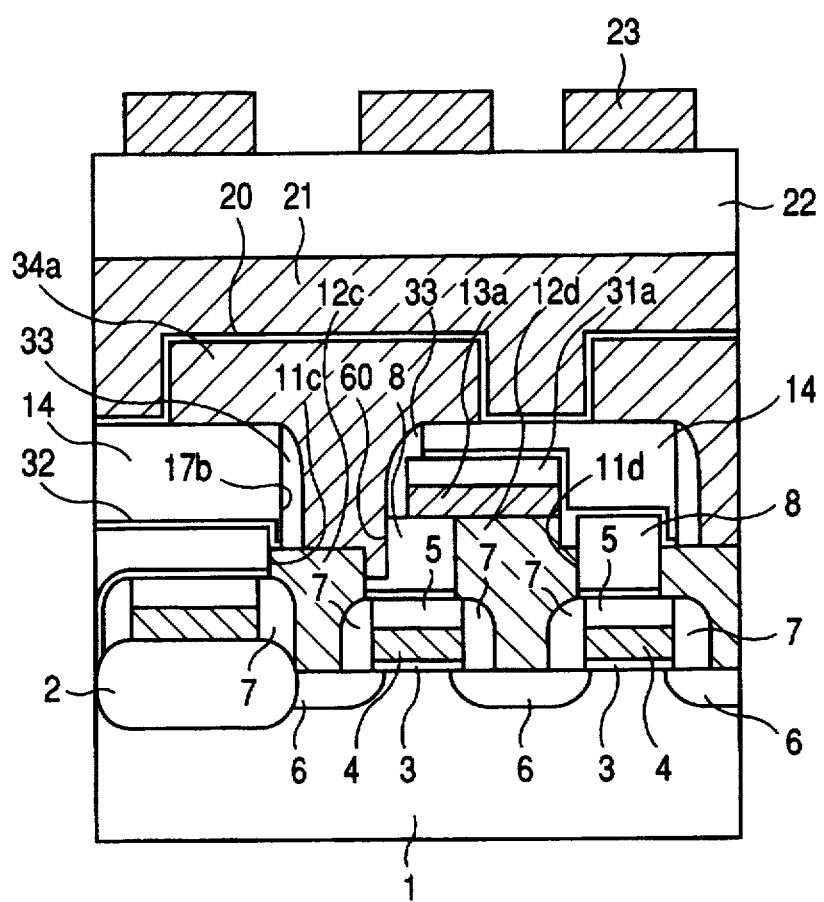
FIG. 44 is a sectional view of a fifth process step of the manufacturing of the semiconductor device in the sixth embodiment.
Figure 45:
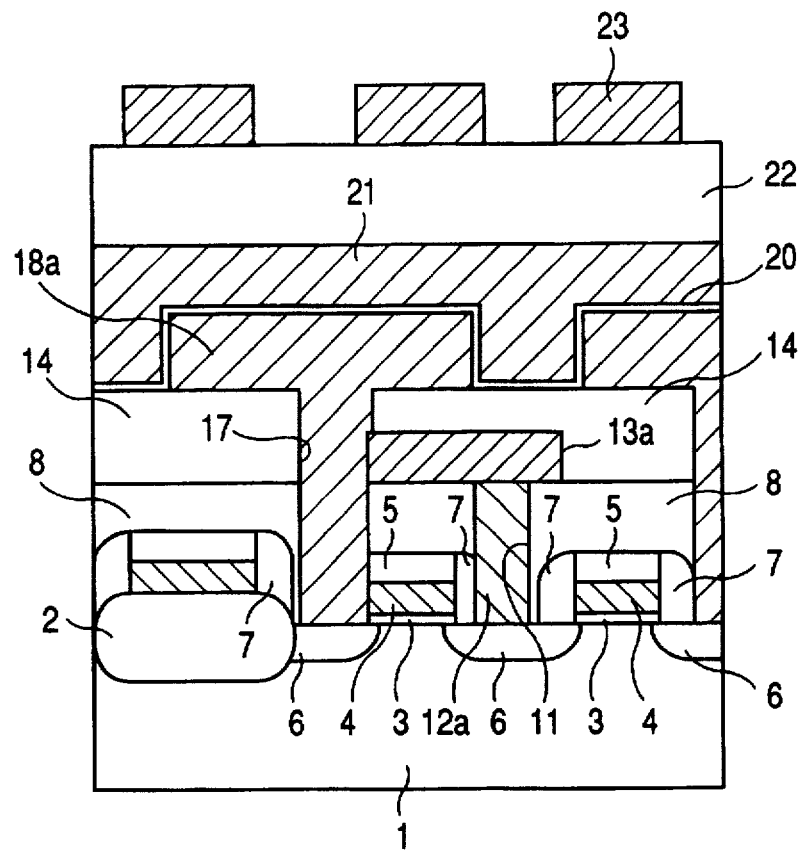
FIG. 45 is a sectional view of a semiconductor device.
Figure 46:
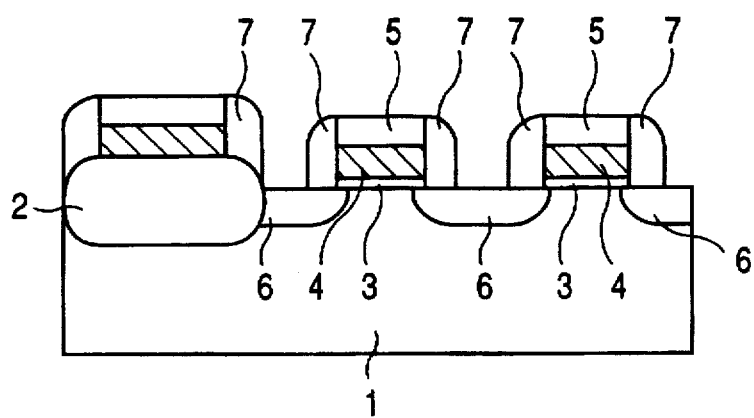
FIG. 46 is a sectional view of a first process step of a manufacturing of the semiconductor device.
Figure 47:
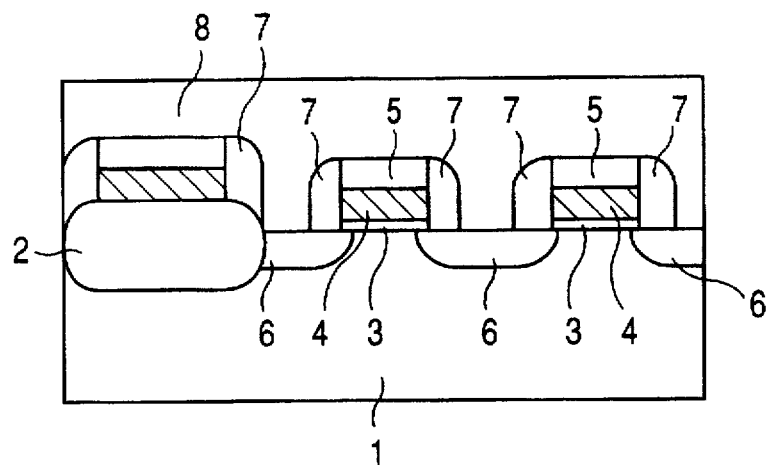
FIG. 47 is a sectional view of a second process step of the manufacturing of the semiconductor device.
Figure 48:
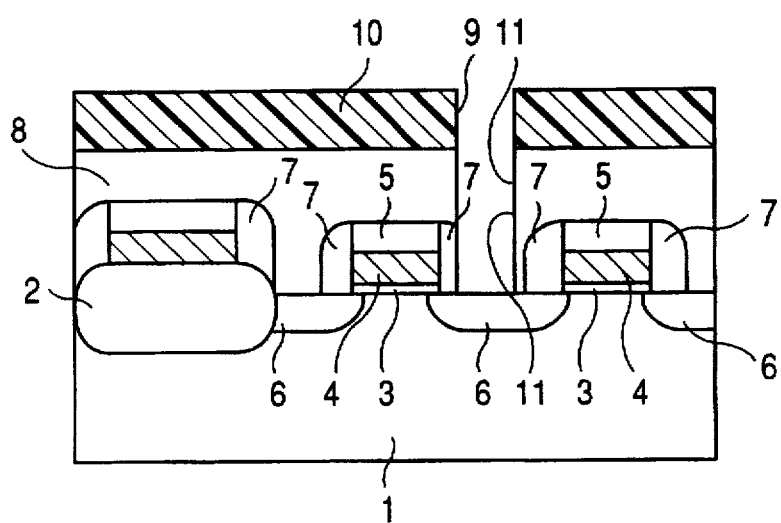
FIG. 48 is a sectional view of a third process step of the manufacturing of the semiconductor device.
Figure 49:
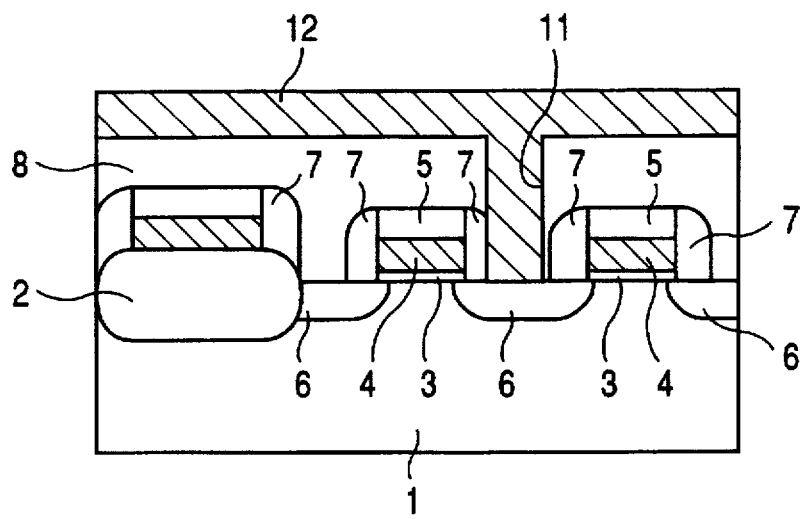
FIG. 49 is a sectional view of a fourth process step of the manufacturing of the semiconductor device.
Figure 50:
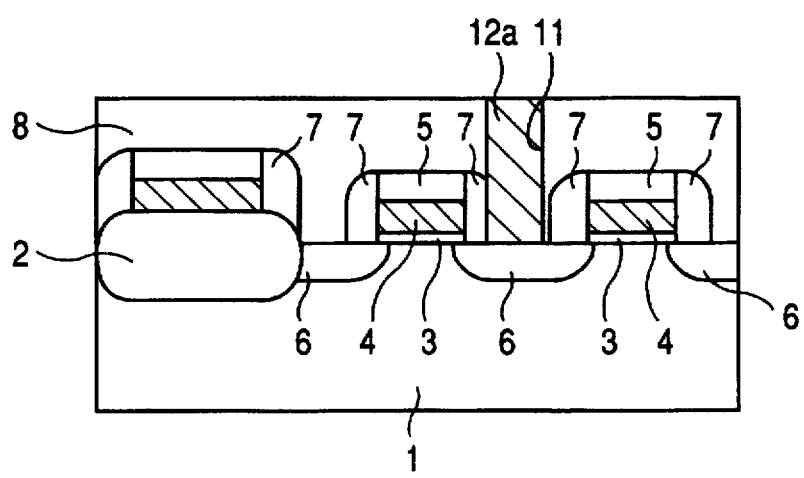
FIG. 50 is a sectional view of a fifth process step of the manufacturing of the semiconductor device.
Figure 51:
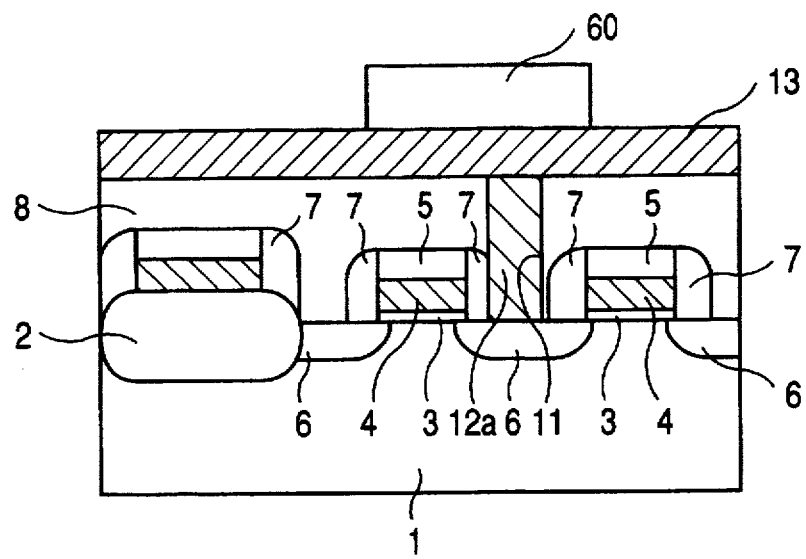
FIG. 51 is a sectional view of a sixth process step of the manufacturing of the semiconductor device.
Figure 52:
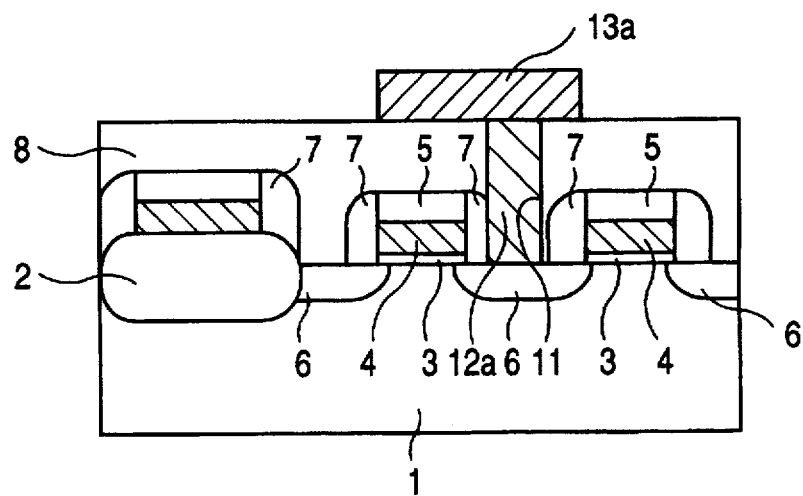
FIG. 52 is a sectional view of a seventh process step of the manufacturing of the semiconductor device.
Figure 53:
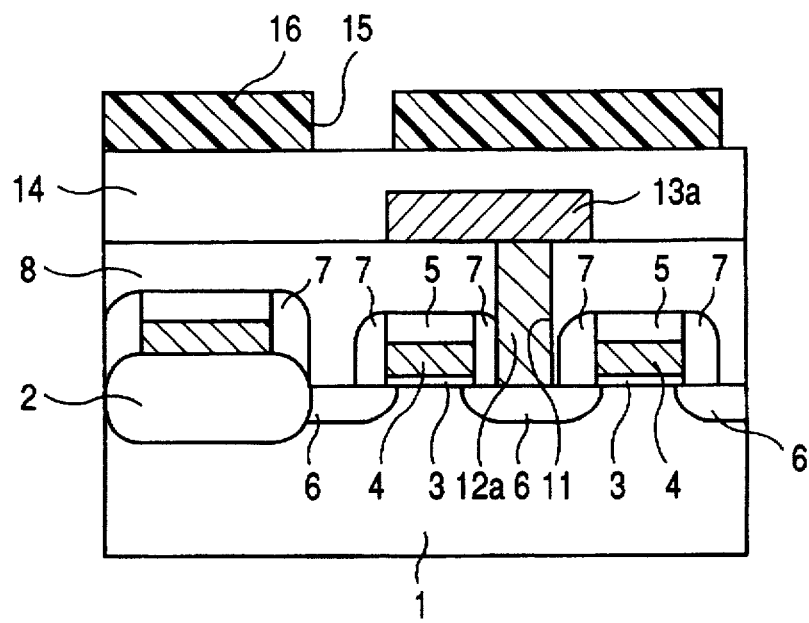
FIG. 53 is a sectional view of a eighth process step of the manufacturing of the semiconductor device.
Figure 54:
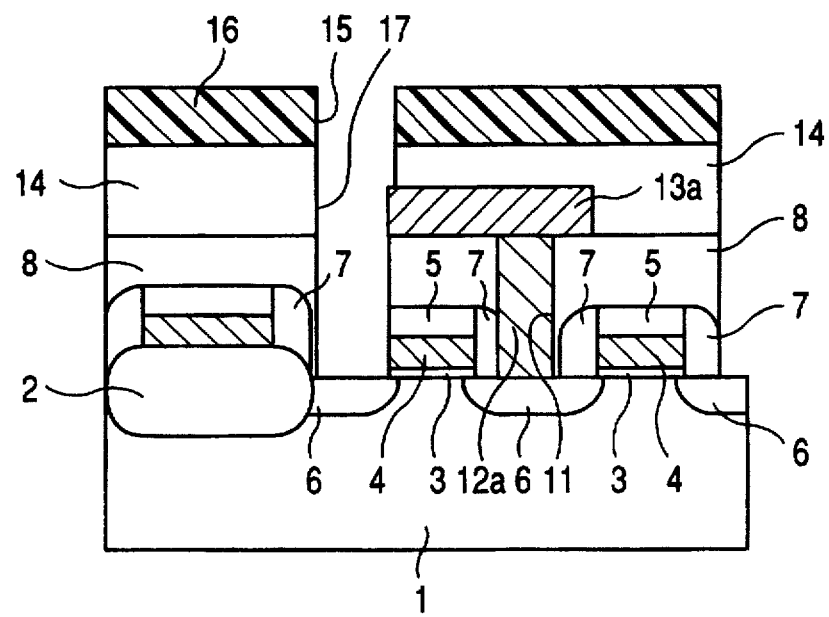
FIG. 54 is a sectional view of a ninth process step of the manufacturing of the semiconductor device.
Figure 55:
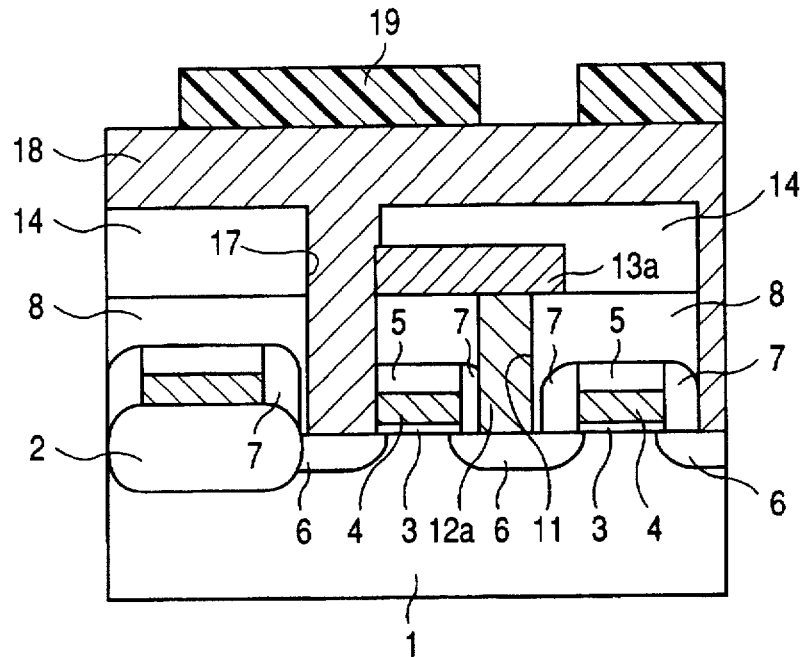
FIG. 55 is a sectional view of a tenth process step of the manufacturing of the semiconductor device.
Figure 56:
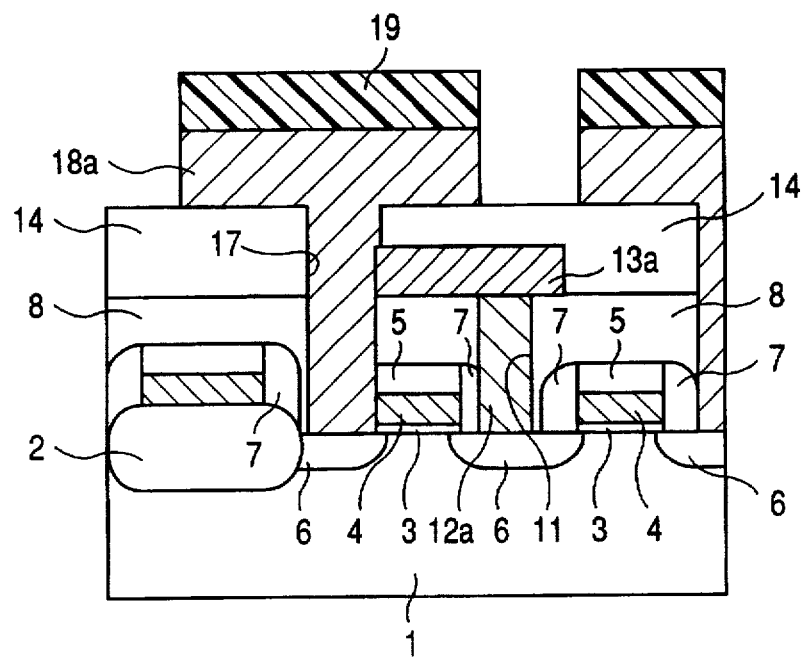
FIG. 56 is a sectional view of an eleventh process step of the manufacturing of the semiconductor device.
Figure 57:
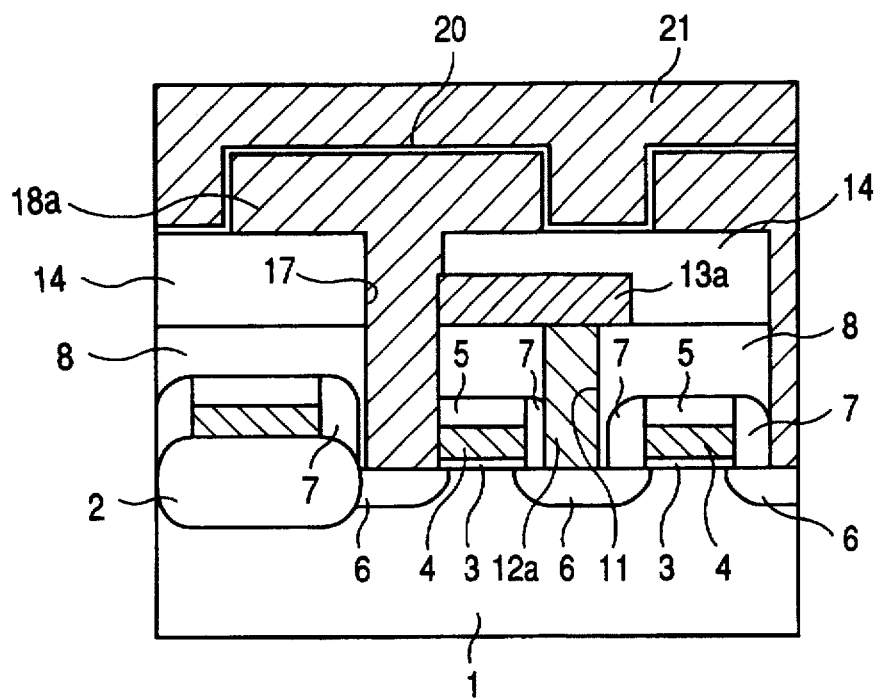
FIG. 57 is a sectional view of a twelfth process step of the manufacturing of the semiconductor device.
Figure 58:
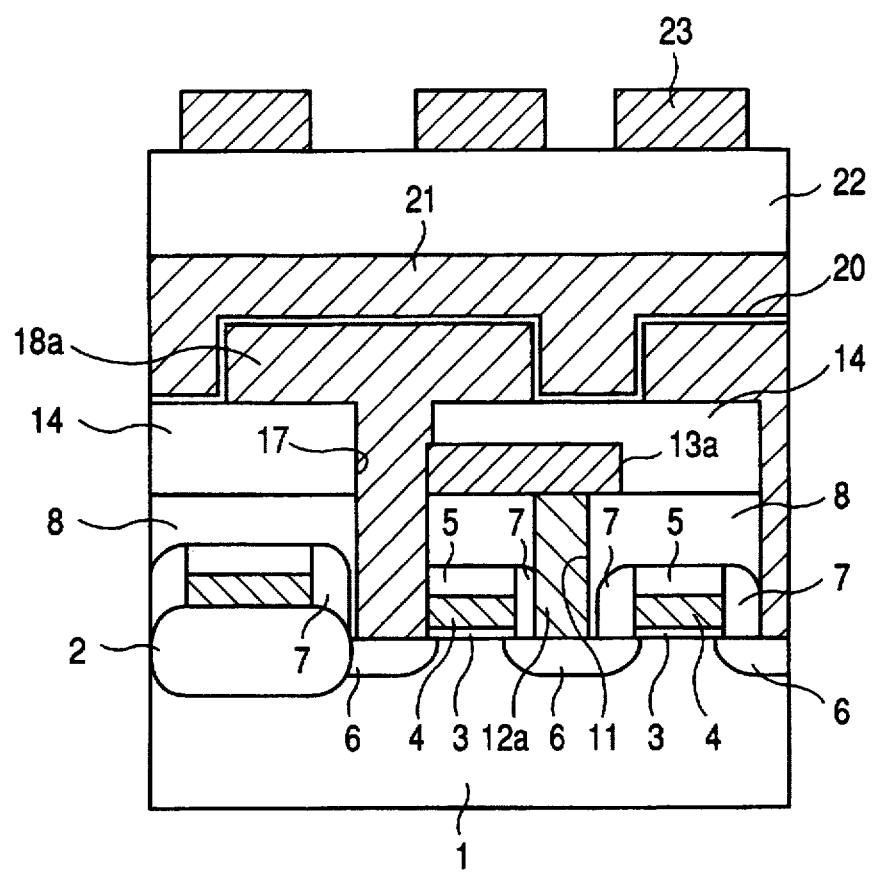
FIG. 58 is a sectional view of a thirteenth process step of the manufacturing of the semiconductor device.
Figure 59:
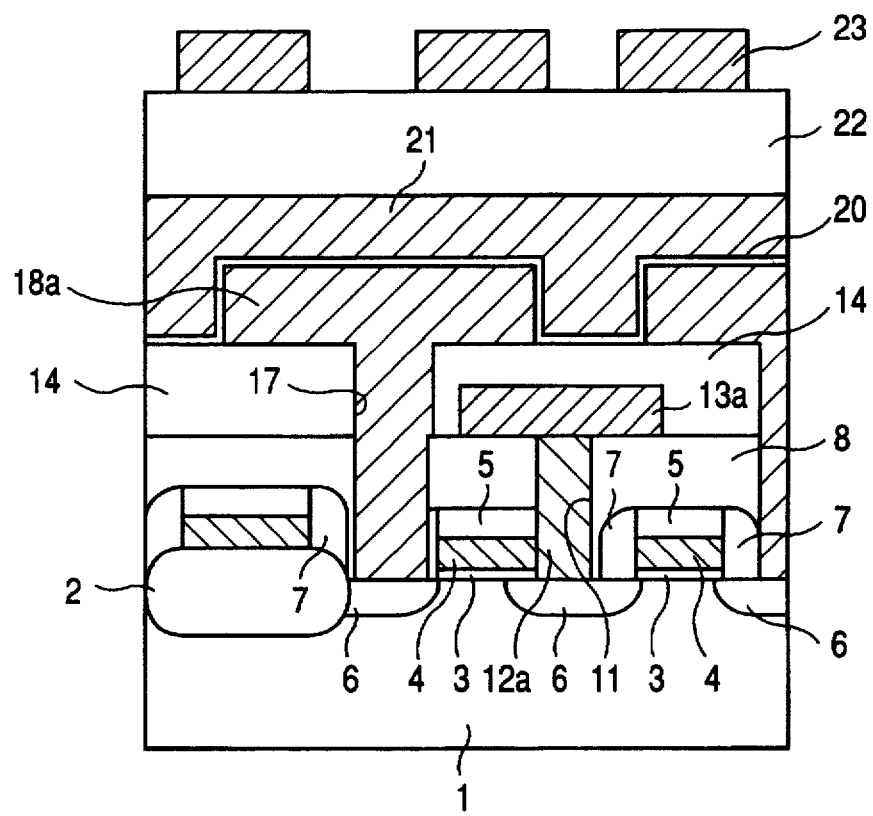
FIG. 59 is a sectional view of another semiconductor device.

As shown in FIG. 44, the semiconductor device can be formed by creating the induced electricity layer 20, the lower electrode 34a and the upper electrode 21, the insulating film layer 22 and the wiring layer 23 through the same process as of the first embodiment.

As described above, according to the semiconductor device and method of manufacturing thereof in the sixth embodiment, the lower electrode 34a of the capacitor which is formed on the silicon dioxide film 14 and in the contact hole 17b except for the side wall spacer 33 is connected to part of the side surface of the first electric conductor 12c in addition to part of the upper surface of the first electric conductor 12c electrically. If the contact hole 17b has a little gap and is formed to the contact hole 11c, the contact area of the side surface of the first electric conductor 12c and the lower electrode 34a is added, even though the contact area of the upper surface of the first electric conductor 12c and the lower electrode 34a is decreased. Therefore, the semiconductor device can be obtained with a good electric resistance characteristics between the lower electrode 34a and the silicon substrate 1.

Further, the third wiring layer 34b may be formed instead of the capacitor as the second embodiment. The third wiring layer comprises polysilicon containing phosphorus of $1\times10^{19}$–$8\times10^{20}$/cm$^3$. In this case, the semiconductor can obtain the same effectiveness as the sixth embodiment.

Furthermore, as in the fourth embodiment and the fifth embodiment, the third electric conductor 50a may be formed in the contact hole 17b except for the side wall spacer 33, and the third wiring layer 34b or the lower electrode 34a may be formed on the third electric conductor 50a and the silicon dioxide film 14. In this case, the semiconductor device can be obtained with the same effectiveness as the sixth embodiment.

As described above, according to the present invention, since the bit line and the gate electrode are formed without exposure when the contact hole is formed, a highly-integrated semiconductor device is formed without any short circuit between the electrode of capacitor and the bit line or the gate electrode and without any short circuit between the bit line and the gate electrode.

What is claimed is:

1. A semiconductor device comprising:
   a first wiring layer formed on a main surface of a semiconductor substrate,
   a first insulating film layer formed on said first wiring layer having a first and a second contact hole which reach said main surface of said semiconductor substrate,
   a second wiring layer formed on said first insulating film layer,
   a first electric conductor, electrically connected to said semiconductor substrate, formed in said first contact hole, self-aligned with respect to said first wiring layer and electrically isolated from said first wiring layer,
   a second electric conductor, electrically connecting said second wiring layer to said semiconductor substrate, in said second contact hole, self-aligned with respect to and is electrically isolated from said first wiring layer,
   a second insulating film layer formed on said first insulating layer and on said second wiring layer and having a third contact hole which reaches said first contact hole, and
   one of a first electrode and a third wiring layer, formed on said second insulating film layer and in said third contact hole, self-aligned with respect to said second wiring layer, electrically connected to said first electric conductor and electrically isolated from said second wiring layer.

2. The semiconductor device of claim 1,
   said first insulating film layer and said second insulating film layer, each further comprising an upper layer and a lower layer,
   said lower layers comprising silicon nitride or silicon oxynitride and said upper layers comprising silicon dioxide.

3. The semiconductor device of claim 2, wherein said second wiring layer comprises an upper layer and a lower layer.

4. The semiconductor device of claim 1, wherein heights of said first electric conductor and said second electric conductor from said semiconductor substrate are substantially equal to a height of said first insulating layer from said semiconductor substrate.

5. The semiconductor device of claim 1, wherein said one of first electrode and third wiring layer is connected electrically to a upper surface and a side surface of said first electric conductor through said third contact hole.

6. The semiconductor device of claim 1, wherein said one of first electrode and said third wiring layer, comprises one of a second electrode and a fourth wiring layer formed on said second insulating film layer and a third electric conductor, electrically connecting said second electrode or said fourth wiring layer to said first electric conductor electrically isolated from said second wiring layer, formed in said third contact hole, and self-aligned with respect to said second wiring layer.

7. The semiconductor device of claim 6, wherein said third electric conductor is electrically connected to said upper surface and said side surface of said first electric conductor.

8. The semiconductor device of claim 6, wherein said second electrode or said fourth wiring layer comprises a metal or a metal compound and said third electric conductor controls a diffusion of said metal or said metal compound.

9. The semiconductor device of claim 6, wherein heights of said first electric conductor and said second electric conductor from said semiconductor substrate are substantially equal to a height of said first insulating layer from said semiconductor substrate.

* * * * *